(12) United States Patent
Sutardja et al.

(10) Patent No.: US 7,280,060 B1
(45) Date of Patent: *Oct. 9, 2007

(54) COMMUNICATION DRIVER

(75) Inventors: Sehat Sutardja, Cupertino, CA (US);
Pierte Roo, Mountain View, CA (US)

(73) Assignee: Marvell International Ltd., Hamilton (BM)

( * ) Notice: Subject to any disclaimer, the term of this patent is extended or adjusted under 35 U.S.C. 154(b) by 284 days.

This patent is subject to a terminal disclaimer.

(21) Appl. No.: 10/972,143

(22) Filed: Oct. 25, 2004

Related U.S. Application Data

(63) Continuation of application No. 10/191,924, filed on Jul. 8, 2002, now Pat. No. 6,844,837, which is a continuation-in-part of application No. 09/920,241, filed on Aug. 1, 2001, and application No. 09/737,474, filed on Dec. 18, 2000, now Pat. No. 6,462,688, application No. 10/972,143, which is a continuation-in-part of application No. 09/737,743, filed on Dec. 18, 2000, and a continuation-in-part of application No. 09/629,092, filed on Jul. 31, 2000, now Pat. No. 6,777,529

(60) Provisional application No. 60/211,571, filed on Jun. 15, 2000, and provisional application No. 60/206,409, filed on May 23, 2000.

(51) Int. Cl.
*H03M 1/66* (2006.01)

(52) U.S. Cl. ..................... 341/144; 375/259
(58) Field of Classification Search ........... 341/143, 341/144, 153; 375/259, 296, 297
See application file for complete search history.

(56) References Cited

U.S. PATENT DOCUMENTS

| | | | |
|---|---|---|---|
| 3,500,215 A | 3/1970 | Leuthold et al. | |
| 3,521,170 A | 7/1970 | Leuthold et al. | |
| 3,543,009 A | 11/1970 | Voelcker, Jr. | |
| 3,793,589 A | 2/1974 | Puckette | |

(Continued)

FOREIGN PATENT DOCUMENTS

| | | |
|---|---|---|
| JP | 57-48827 | 3/1982 |
| JP | 62-159925 | 7/1987 |
| JP | 63-300700 | 7/1988 |
| JP | 1-204527 | 8/1989 |

(Continued)

OTHER PUBLICATIONS

"Gigabit Ethernet 1000BASE–T Whitepaper", Gigabit Ethernet Alliance, copyright 1977.
H4000 Digital Ethernet Transceiver Technical Manual, Distributed Systems, chapter 3, pp. 3–1 to 3–11, Copyright 1982 by Digital Equipment Corporation.
Sedra et al., "Operational Amplifiers," Microelectronic Circuits, Third Edition, Chapter 2, Section 2.4, 1991, pp. 61–63.

(Continued)

*Primary Examiner*—Howard Williams

(57) ABSTRACT

An Ethernet controller includes a plurality of sets of digital-to-analog converters (DACs). Each DAC receives an input signal and provides an output signal. Each of the plurality of sets of DACs includes a plurality of sets of replica current circuits. Each DAC includes current sources. Each current source includes a respective control input. The output signal provided by each DAC includes a sum of outputs of the current sources. Each DAC also includes delay elements. An input of a first one of the delay elements receives the input signal. An mth one of the delay elements includes an input in communication with an m-1th one of the delay elements. An output of one of the delay elements controls a corresponding control input of one of the current sources. A sum of each output signal from a respective one of the plurality of sets of DACs forms an accumulated output signal.

175 Claims, 18 Drawing Sheets

U.S. PATENT DOCUMENTS

| | | | |
|---|---|---|---|
| 4,112,253 | A | 9/1978 | Wilhelm |
| 4,152,541 | A | 5/1979 | Yuen |
| RE30,111 | E | 10/1979 | Blood, Jr. |
| 4,362,909 | A | 12/1982 | Snijders et al. |
| 4,393,370 | A | 7/1983 | Hareyama |
| 4,393,494 | A | 7/1983 | Belforte et al. |
| 4,503,421 | A | 3/1985 | Hareyama et al. |
| 4,535,206 | A | 8/1985 | Falconer |
| 4,727,566 | A | 2/1988 | Dahlqvist |
| 4,746,903 | A | 5/1988 | Czarniak et al. |
| 4,878,244 | A | 10/1989 | Gawargy |
| 4,888,762 | A | 12/1989 | Arai |
| 4,935,919 | A | 6/1990 | Hiraguchi |
| 4,947,171 | A | 8/1990 | Pfeifer et al. |
| 4,999,830 | A | 3/1991 | Agazzi |
| 5,043,730 | A | 8/1991 | obinata |
| 5,153,450 | A | 10/1992 | Ruetz |
| 5,202,528 | A | 4/1993 | Iwaooji |
| 5,222,084 | A | 6/1993 | Takahashi |
| 5,254,994 | A | 10/1993 | Takakura et al. |
| 5,305,379 | A | 4/1994 | Takeuchi et al. |
| 5,307,405 | A | 4/1994 | Sih |
| 5,357,145 | A | 10/1994 | Segaram |
| 5,388,092 | A | 2/1995 | Koyama et al. |
| 5,418,478 | A | 5/1995 | Van Brunt et al. |
| 5,517,435 | A | 5/1996 | Sugiyama |
| 5,539,405 | A | 7/1996 | Norsworthy |
| 5,539,773 | A | 7/1996 | Knee et al. |
| 5,572,159 | A | 11/1996 | McFarland |
| 5,579,004 | A | 11/1996 | Linz |
| 5,585,795 | A | 12/1996 | Yuasa et al. |
| 5,585,802 | A | 12/1996 | Cabler et al. |
| 5,596,439 | A | 1/1997 | Dankberg et al. |
| 5,625,357 | A | 4/1997 | Cabler |
| 5,651,029 | A | 7/1997 | Yang et al. |
| 5,659,609 | A | 8/1997 | Koizumi et al. |
| 5,663,728 | A | 9/1997 | Essenwanger |
| 5,666,354 | A | 9/1997 | Cecchi et al. |
| 5,760,726 | A | 6/1998 | Koifman et al. |
| 5,790,658 | A | 8/1998 | Yip et al. |
| 5,796,725 | A | 8/1998 | Muraoka |
| 5,821,892 | A | 10/1998 | Smith |
| 5,822,426 | A | 10/1998 | Rasmus et al. |
| 5,825,819 | A | 10/1998 | Cogburn |
| 5,864,587 | A | 1/1999 | Hunt |
| 5,878,340 | A | 3/1999 | Asaoka |
| 5,887,059 | A | 3/1999 | Xie et al. |
| 5,898,340 | A | 4/1999 | Chatterjee et al. |
| 5,936,450 | A | 8/1999 | Unger |
| 5,940,498 | A | 8/1999 | Bardl |
| 6,163,283 | A | 12/2000 | Schofield |
| 6,172,634 | B1 | 1/2001 | Leonowich et al. |
| 6,201,841 | B1 | 3/2001 | Iwamatsu et al. |
| 6,204,788 | B1 | 3/2001 | Tani |
| 6,236,346 | B1 | 5/2001 | Schofield et al. |
| 6,249,164 | B1 | 6/2001 | Cranford, Jr. et al. |
| 6,295,012 | B1 | 9/2001 | Greig |
| 6,307,490 | B1 | 10/2001 | Litfin et al. |
| 6,309,077 | B1 | 10/2001 | Saif et al. |
| 6,332,004 | B1 | 12/2001 | Chan |
| RE37,619 | E | 4/2002 | Mercer et al. |
| 6,373,908 | B2 | 4/2002 | Chan |
| 6,411,647 | B1 | 6/2002 | Chan |
| 6,462,688 | B1 | 10/2002 | Sutardja |
| 6,468,032 | B2 | 10/2002 | Patel |
| 6,476,476 | B1 | 11/2002 | Glenn |
| 6,476,746 | B2 | 11/2002 | Viswanathan |
| 6,477,200 | B1 * | 11/2002 | Agazzi et al. ............... 375/233 |
| 6,535,987 | B1 | 3/2003 | Ferrant |
| 6,556,677 | B1 | 4/2003 | Hardy |
| 6,566,677 | B2 | 5/2003 | Kano et al. |
| 6,570,931 | B1 | 5/2003 | Song |
| 6,576,746 | B2 | 6/2003 | McBride et al. |
| 6,577,114 | B1 | 6/2003 | Roo |
| 6,594,304 | B2 | 7/2003 | Chan |
| 6,633,178 | B2 | 10/2003 | Wilcox et al. |
| 6,687,286 | B1 * | 2/2004 | Leonowich et al. ........ 375/219 |
| 6,744,931 | B2 | 6/2004 | Komiya et al. |
| 6,765,931 | B1 | 7/2004 | Rabenko et al. |
| 6,775,529 | B1 | 8/2004 | Roo |
| 6,864,726 | B2 | 3/2005 | Levin et al. |
| 6,980,644 | B1 | 12/2005 | Sallaway et al. |
| 2001/0050585 | A1 | 12/2001 | Carr |
| 2004/0105504 | A1 * | 6/2004 | Chan .......................... 375/257 |
| 2004/0208312 | A1 | 10/2004 | Okuda |

FOREIGN PATENT DOCUMENTS

| | | |
|---|---|---|
| JP | 05-064231 A | 3/1993 |
| JP | 06-029853 | 2/1994 |
| JP | 06-97831 | 4/1994 |
| JP | 6-276182 | 9/1994 |
| JP | 09-55770 | 8/1995 |
| JP | 09-270707 | 3/1996 |
| JP | 2001-177409 | 12/1999 |
| WO | WO 99/46867 | 9/1999 |
| WO | WO 00/27079 | 5/2000 |
| WO | WO 00/28663 A3 | 5/2000 |
| WO | WO 00/28663 A2 | 5/2000 |
| WO | WO 00/28668 | 5/2000 |
| WO | WO 00/28691 A2 | 5/2000 |
| WO | WO 00/28691 A3 | 5/2000 |
| WO | WO 00/28712 | 5/2000 |
| WO | WO 00/35094 | 6/2000 |

OTHER PUBLICATIONS

Stonick et al; An Adaptive PAM–4–5–Gb/s Backplane Transceiver in 0.25–um CMOS; IEEE Journal of Solid–State Circuits, vol. 38, No. 3, Mar. 2003; pp. 436–443.

IEEE Standards 802.3ab–2002, "Part 3: Carrier sense multiple access with collision detection (CSMA/CD) access method and physical layer specifications", pp. 147–249 Mar. 2002.

Harald, et al.; "Design of a 10–bit 100 MSamples/s BiC-MOS D/A Converter", 1996, pp. 730–733.

Sailesh Rao; Short Course: Local Area Networks, International Solid State Circuits Conference; Sailesh Rao; Outline Implementing Gigabit Ethernet Over Cat–5 Twisted–Pair Cabling; Jack Kenny; Signal Processing and Detection in Gigabit Ethernet; 3 pages no date.

Kamran Azadet and Chris Nicole; Low–Power Equilizer Architectures for High–Speed Modems; Oct. 1998; pp. 118–126 IEEE Communications Magazine.

Techdictionary.com definition of decoder, Link http://www.techdictionary.com; 1 page no date.

University of Pennsylvania CSE Digital Logic Lab re decoders. Link: http://www.cse,dmu.ac.uk/~sexton/WWW/Pages/cs2.html; 3 pages no date.

Progress in High–Speed and High–Resolution CMOS Data Converters; V. Liberali, S. Brigate, F. Francesconi, F. Maloberti; 1995 20th International Conference on Microelectronics;, Nis, Serbia, Sep. 1995; 12 pages.

Micro–Electronic Circuits, Adel S. Sedra; 1982; pp. 95–97 and 243–247 no month.

DP83220 CDL Twisted Pair FDDI Transceiver Device; National Semiconductor; Oct. 1992; 10 pages.

A CMOS Oversampling D/A Converter with a Current–Mode Semidigital Reconstruction Filter; David K. Su and Bruce A. Wooley; IEEE Journal of Solid–State Circuits, vol. 28 No. 12. Dec. 1993; 10 pages.
Gigabit Ethernet PHY Chip Sets LAN Speed Record for CopperStory; Lee Goldberg; 1998; 6 pages no full date given.
AN 80–MHz 8–bit CMOS D/A Converter; Takahiro Miki et al; IEEE Journal of Solid–State Circuits, vol. SC021, No. 6, Dec. 1986; pp. 983–988.
A High–Performance CMOS 70–MHz Palette/DAC; Lawrence Letham et al; IEEE Journal of Solid–State Circuits, vol. SC–22, No. 6, Dec. 1987, pp. 1041–1047.
A 10–b 70–Ms/s CMOS D/A Converter; Yasuyuki Nakamura et al; IEEE Journal of Solid–State Circuits, vol. 26, No. 4, Apr. 1991; pp. 637–642.
A 10 bit 80 MHz Glitchless CMOS D/A Converter; Hiroshi Takakura et al; IEEE 1991 Custom Integrated Circuits Conference; 4 pages no date.
A 130–MHz 8–b CMOS Video DAC for HDTV Applications; Jean Michel Fournier and Patrice Senn; IEEE Journal of Solid–State Circuits, vol. 26, No. 7, Jul. 1991; pp. 1073–1077.
WP 3.2: A 320MHz CMOS Triple 8b DAC with On–Chip PLL and Hardware Cursor; David Reynolds; 1994 IEEE International Solid–State Circuits Conference; pp. 50–51 no month.
A 10–b 125–MHz CMOS Digital–to–Analog Converter (DAC) with Threshold–Voltage Compensated Current Sources; Shu–Yuan Chin and Chung–Yu Wu; IEEE Journal of Solid–State Circuits; vol. 29, No. 11, Nov. 1994; pp. 1374–1380.
A Low Glitch 10–bit 75–MHz CMOS Video D/A Converter; Tien–Yu Wu et al; IEEE Journal of Solid–State Circuits, vol. 30. No. 1, Jan. 1995; pp. 68–72.
The Authoritative Dictionary of IEEE Standards Stems $7^{th}$ Edition, p. 280 no date.
Analysis and Design of Analog Integrated Circuits, Fourth Edition; Paul R. Gray et al; 2001; pp. 217–221 no month.
A 0.2–2GHz 12mW Multiplying DLL for Low–Jitter Clock Synthesis in Highly–Integrated Data Communication Chips; Ramin Farjad–rad et al; 2002 IEEE International Solid–State Circuits Conference; 8 pages no date.
All–Digital Multi–Phase Delay Locked Loop for Internal Timing Generation in Embedded and/or High–Speed DRAMs; Kohtaroh Gotoh et al; 1997 Sumposium on VLSI Circuits Digest of Technical Papers; pp. 107–108 no date.
THAM 11.3: A Variable Delay Line Phase Locked Loop for CPU–Coprocessor Synchronization; Mark G. Johnson et al; 1988 IEEE International Solid–State Circuits Conference; Feb. 18, 1988; pp. 142–143, 334–336.
FAM 11.5: A Monolithic CMOS 10MHz DPLL for Burst–Mode Data Retiming; Jeff Sonntag and Robert Leonowich, AT&T Bell Laboratories; 1990 IEEE International Solid–State Circuits Conference; pp. 194–195, 294 no date.
A Portable Digital DLL Architecture for CMOS Interface Circuits; Bruno W. Garlepp et al; 1988 Symposium on VLSI Circuits Digest of Technical Papers; pp. 214–215 no date.
A Register–Controlled Symmetrical DLL for Double–Date–Rate DRAM; Feng Lin et al; IEEE Journal of Solid–State Circuits, vol. 34, No. 4, Apr. 1999; pp. 565–568.
A Portable Digital DLL for High–Speed CMOS Interface Circuits; Bruno W. Garlepp et al.; IEEE Journal of Solid–State Circuits, vol. 34, No. 5, May 1999; pp. 632–644.

Clock–Deskew Buffer Using a SAR–Controlled Delay–Locked Loop; Guang–Kaai Dehng et al; IEEE Journal of Solid–State Circuits, vol. 35, No. 8, Aug. 2000; pp. 1128–1136.
A Low–Power Small–Area ± 7.28–ps–Jitter 1–GHz DLL–Based Clock Generator; Ghulwoo Kim et al; IEEE Journal of Solid–State Circuits, vol. 37, No. 11, Nov. 2002; pp. 1414–1420.
A Fast–Lock Mixed–Mode DLL Using a 2–b SAR Algorithm; Guang–Kaai Dehng, et al; IEEE Journal of Solid–State Circuits, vol. 36, No. 10, Oct. 2001; pp. 1464–1471.
A 10–b, 500–M Sample/s CMOS DAC in 0.6 mm2; Chi–Hung Lin and Klaas Bult; IEEE Journal of Solid–State Circuits, vol. 33, No. 12, Dec. 1996; pp. 1948–1958.
ISSCC 1999 Short Course; Implementing Gigabit Ethernet Over CAT–5 Twisted Pair Cabling; Sailesh Rao; 3 pages no date.
WP 23.8 A 9.8GHz Back–Gate Tuned VCO in 0.35 µm CMOS; HongMo Wang; 1999 IEEE International Solid–State Circuits Conference; pp. 406–407, 484 no date.
A 1.9–GHz Wide–Band IF Double Conversion CMOS Receiver for Cordless Telephone Applications; Jacques C. Rudell et al; IEEE Journal of Solid–State Circuits, vol. 32, No. 12, Dec. 1997; pp. 2071–2088.
Principles of Data Conversion System Design; Behzad Razavi; 1995; 137 pages no date.
Digital Logic and Computer Design; M. Morris Mano; 1979; 627 pages no date.
Hellwarth. et al., "Digital–to–analog Converter having Common–mode Isolation and Differential Output". IBM Journal of Research & Development, no date.
Sedra et al., Microelectronic Circuits, Third Edition, 1991, pp. 48–115 no month.
Lee, et al., "A CMOS Serial Link for Fully Duplexed Data Communication", Apr. 1995. IEEE.
Shoval et al., "WA 18.7 –A Combined 10/125 Mbaud Twisted–Pair Line Driver with Programmable Performance/Power Features," 2000, pp. 314–315–IEE 2000 ISSCC.
Song, et al., FP 12.1: NRZ Timing Recovery Technique for Band–Limited Channels (Slide Supplement), 1996. IEEE Issue 1996
Chien, "Monolithic CMOS Frequency Synthesizer for Cellular Applications", Mar. 12–13. No year.
Chien, "Delay Based Monolithic CMOS Frequency Synthesizer for Portable Wireless Applications", May 20, 1998.
Chien, "Low–Noise Local Oscillator Design Techniques using DLL–based Frequency Multiplier for Wireless Applications", 2000. no month
Cho et al.; "A Single–Chip CMOS Direct Conversion Transceiver for 900 MHz Spread–Spectrum Digital Cordless Telephones"; 1999 no month .
Shoval et al.; "A CMOS Mixed–Signal 100Mb/s Receive Architecture for Fast Ethernet"; 1998 IEEE CLCC no month.
Hester et al.; "CODEC for Echo–Canceling Full–Rate ADSL Modems"; Dec. 1999 IEEE.
Nack, et al., "A Constant Slew Rate Ethernet Line Driver", May 2001. IEEE
Song, "Dual Mode Transmitter with Adaptively Controlled Slew Rate and Impedence Supporting Wide Range Data Rates", 2001. IEEE no month.
Yee et al., An Integratable 1–2.5 Gbps Low Jitter CMOS Transceiver with Built in Self Test Capability, 1999 no month.

Intersil. HC–5509B ITU CO/Loop Carrier SLIC, Aug. 2003.
Regan, ADSL Line Driver/Receiver Design Guide, Part 1, Feb. 2000 Linear Technology Magazine.
Philips, The HC–5502X14X Telephone Subscriber Line Interface Circuits (SLIC), Jan. 1997.
Fuad Surial Atiya, et al., An Operational Amplifier Circulator Based on the Weighted Summer, Jun. 1975.
Narayanan et al., Doppler Estimation Using a Coherent Ultrawide–Band Random Noise Radar, Jun. 2000.
Stephens, Active Output Impedence for ADLS Line Drivers, Nov. 2002.
Hellums et al., An ADSL Integrated Active Hybrid Circuit no date.
Azadet et al., A Gigabit Transceiver Chip Set for UTP CA–6 Cables in Digital CMOS Technology, Feb. 2000 IEEE ISSCC.
He et al., A DSP Receiver for 1000 Base–T PHY, 2001 no month.
Baird et al., A Mixed Sample 120M s PRML Solution for DVD Systems, 1999 no month.
Baker, An Adaptive Cable Equalizer for Serial Digital Rates to 400Mb/s, 1996 no month.
Everitt et al., A 10/100Mb/s CMOS Ethernet Transceiver for 10BaseT, 10BaseTX and 100Base FX, 1998 no month.
Roo et al., A CMOS Transceiver Analog Front–end for Gigabit Ethernet over Cat–5 Cables, 2001 no month.
Shoaei et al., A 3V Low Power 0.25um CMOS 100/Mb/s Receiver for Fast Ethernet, 2000 no month.
Walker et al., A Two Chip 1.5 GBd Serial Link Interface, Dec. 1992.
Chien, et al., "TP 12.4: A 900–MHz Local Oscillator using a DLL–based Frequency Multiplier Technique for PCS Applications". no date given.
Johns, et al., "Integrated Circuits for Data Transmission Over Twisted Pair Channels", Mar. 1997, pp. 398–406.
"IEEE Standard 802.3: Part 3 Carrier Sense Multiple Access with Collision Detection (CSMA/CD) Access Method and Physical Detection", Mar. 8, 2002, pp. 1–1538.
Young, et al., "A Low–Noise RF Voltage–Controlled Oscillator Using On–Chip High–Q Three–Dimensional Coil Inductor and Micromachined Variable Capacitor", Jun. 8–11, 1998, pp. 128–131.
Young, et al., "A Micromachined Variable Capacitor for Monolithic Low–Noise VCOS", 1996, pp. 86–89. no month.
Abidi, et al., "FA 7.2: The Future of CMOS Wireless Transceivers", Feb. 7, 1997, pp. 118–119, 440.
Eto, et al., "A 333 MHz, 20mW, 18ps Resolution Digital DLL using Current–controlled Delay with Parallel Variables Resistor DAC (PVR–DAC)", Aug. 28–30, 2000, pp. 349–350.
Ivan Jorgensen, et al., "Design of a 10–bit 100 MSamples/s BiCMOS D/A Converter", 1996, pps. 730–733. no month.
Henriques, et al., "A CMOS Steering–Current Multiplying Digital–to–Analog Converter", 1996, pp. 730–733 no month.
Wikner, et al., "Modeling of CMOS Digital–to–Analog Converters for Telecommunication", May, 1999, pp. 489–499.
Van der Plas. et al., "A 14–Bit Intrinsic Accuracy $Q^2$ Random Walk CMOS DAC" , Dec. 1999, pp. 1708–1718.
Radke, et al., "A 14–Bit Current–Mode $\Sigma\Delta$ DAC Based Upon Rotated Data Weighted Averaging", Aug. 2000, pp.1074–1084.

Shui, et al., "Mismatch Shaping for a Current–Mode Multibit Current–Mode Multibit Delta–Sigma DAC", Mar. 1999, pp. 331–338.
Hamasaki, et al., "A 3–V. 22–mV Multibit Current–Mode $\Sigma\Delta$ DAC with 100 dB Dynamic Range", Dec. 1996, pp. 1888–1894.
Van de Plassche, Integrated Analog–to–Digital and Digital–to–Analog Converters –Chapter 6, pp. 211–271 1994 Kluwer Academic no month.
Millman, et al., "Pulse, Digital, and Switching Waveforms", pp. 674–675 no date given.
Tsutomu Kamoto, "An 8–bit 2–ns Monolithic DAC", Feb. 1988 IEEE JSSC.
Weaver, Jr., "A Third Method of Generation and Detection of Single–Sideband Signals,"Dec. 1956, pp. 1703–1705.
Niknejad et al., "Analysis and Optimization of Monolithic Inductors and Transformers for RF ICs,"1997, pp. 375–378. no month.
Weigandt et al., "Analysis of Timing Jitters in CMOS Ring Oscillators,"pp. 27–30. No date.
Niknejad et al., "Analysis, Design, and Optimization of Signal Inductors and Transformers for Si RF IC's ,"Oct. 1998, pp. 1470–1481.
American National Standard, "Fibre Distributed Data Interface (FDDI) –Token Ring Twisted Pair Layer Medium Dependent (TP–PMD)," Sept. 25, 1995.
Nguyen et al., "Si IC–Compatible Inductors and LC Passive Filters," Aug. 1990, pp. 1028–1031.
Gardner, "Charge–Pump Phase–Lock Loops," Nov. 1980, pp. 1849–1858.
Dally et al., "High Performance Electrical Signaling". No date.
Davies, "Digital Generatiion of Low–Frequencey Sine Waves," Jun. 1969, pp. 97–105.
Abidi, "TP 11.1: Direct–Conversion Radio Transceivers for Digital Communications," 1995. No month.
Dolle, "A Dynamic Line–Termination Circuit for Multireceiver Nets," Dec. 1993, pp. 1370–1373.
Su et al., "Experimental Results and Modeling Techniques for Substrate Noise in Mixed–Signal Integrated Circuits," Apr. 1993, pp. 420–430.
Gray et al., "Future Directions in Siicon ICs for RF Personal Communications," 1995, pp. 83–90. No month.
Gabara, "On–Chip Terminating Registers for High Speed ECL–CMOS Interfaces" 1992, pp. 292–295. No. month.
Horowitz et al., "High–Speed Electrical Signaling: Overview and Limitations," 1998, pp. 12–24. No month.
Efendovich et al., Multifrequency Zero–Jitter Delay–Locked Loop, Jan. 1994, 67–70.
Munshi et al., Adaptive Impedance Matching, 69–72 no date.
Niknejad et al., Numerically Stable Green Function for Modeling and Analysis of Substrate Coupling in Integrated Circuits, Apr. 1998, 305–315.
Hajimiri et al., Phase Noise in Multi–Gigahertz CMOS Ring Oscillators, 1998, 49–52 no month.
Kim et al., PLL/DLL System Noise Analysis for Low Jitter Clock Synthesizer Design, 31–34. No date
Kim et al., "A 30–MHz Hybrid Analog/Digital Clock Recovery Circuit in 2–µmm CMOS,"1990, pp. 1385–1394 No month.
Liu et al., "WP 23.7: A 6.5 GHz Monolithic CMOS Voltage–Controlled Oscillator," 1999, pp. 404–405, 484 no month.

Rofougaran et al., "SP 24.6: A 900 MHz CMOA LC–Oscillator with Quadtrature Outputs," 1996.

Koullias et al., "TP 9.2: A 900 MHz Transceiver Chip Set for Dual–Mode Cellular Radio Mobile Terminals,"1993, pp. 140–141, 278. No month.

Dauphinee et al., "SP 23.7: A Balanced 1.5 GHz Voltage Controlled Oscillator with an Integrated LC Resonator," 1997, pp. 390–391, 491. No month.

Banu et al., "A BiCMOS Double–Low–IF Receiver for GSM," 1997, pp. 521–524. No month.

Chang et al., "A CMOS Channel–Select Filter for a Direct–Conversion Wireless Receiver," 1996, pp. 62–63. No month.

Waizman, "FA 18.5: A Delay Line Loop for Frequency Synthesis of De–Skewed Clock," Feb. 18, 1994, pp. 298–299.

Kinget, "FP 14.7: A Fully Integrated 2.7V 0.35μm CMOS VCO for 5 GHz Wireless Applications," Feb. 5, 1998.

Lee et al., "A Fully Integrated Low–Noise 1–GHz Frequency Synthesizer Design for Mobile Communication Application,"May 1997, pp. 760–765. IEEE JSSC.

Parker et al., "A Low Noise 1.6–GHz CMOS PLL with On–Chip Loop Filter," 1997, pp. 407, 409–410. No month.

Park et al., "A Low Noise, 900–MHz VCO in 0.6μm CMOS," May 1999, pp. 586–591.

Soyuer et al., "A Monolithic 2.3–Gb/s 100–mW Clock and Data Recovery Circuit in Silicon Bipolar Technology," Dec. 1993, pp. 1310–1313.

Hu et al., "A Monolithic 480 Mb/s Parallel AGC/Decision/Clock–Recovery Circuit in 1.2–μm CMOS," Dec. 1993, pp. 1314–1320.

Parameswaran et al., "A New Approach for the Fabrication of Microchemical Structures," Dec. 6, 1998, pp. 289–307.

Knight, Jr. et al., A Self–Terminating Low–Voltage Swing CMOS Output Driver, 1988, 457–464. Apr. 1998.

Maneatis, Low–Jitter Process–Independent DLL and PLL Based on Self–Based Techniques, Nov./1996, 1723–1732.

Chang et al., Large Suspended Inductors on Silicon and Their Use in a 1–μm CMOS RF Amplifier, May/1994, 246–248.

Gharpurey et al., Modeling and Analysis of Substrate Coupling in Integrated Cicuits, Mar./1996, 344–353.

Razavi, "SP 23.6: A 1.8 GHz CMOS Voltage–Controlled Oscillator,"1997, pp. 388–389. No month.

Dec et al., "MP 4.8: A 1.9 GH2 Micromachine–Based Low–Phase–Noise CMOS VCO,"1999, PP. 80–81, 449. No month.

Sato et al., "SP 21.2: A 1.9 GHz Single–Chip IF Transreceiver for Digital Cordless Phones,"Feb. 10, 1996.

Lee et al., "A 2.5V CMOS Delay–Locked Loop for an 18 Mbit, 500 Megabytes/s DRAM,"1994, PP. 1491–1496. No month.

Lam et al., "WP 23.6: GHz/5.2 GHz CMOS Voltage–Controlld Oscillator,"1999, PP. 402–403, 484. No month.

Marshall et al. , "TA 8.7: a 2.7V GSM Transceiver ICs with On–Chip Filtering,"1995. No month.

Shoval et al., "WA 18.7 –A Combined 10/125 Mbaud Twisted–Pair Line Driver with Programmable Performance/Power Features," 2000, pp. 314–315. 2000 IEEE ISSCC.

Myson Technology,"MTD214 –Ethernet Encoder/Decoder and 10BaseT Transceiver with Built–in Waveform Shaper," 1997, pp. 1–11. No month.

Myson Technology, "MTD972 (Preliminary) 100Base TX PCS/PMA,"1997, pp. 1–21. No month.

Craninckx et al., "1.8–GHz Low–Phase–Noise CMOS VCO Using Optimized Hollow Spiral Inductor," 1997, pp. 736–744. No month.

Craninckx et al., "A 1.8–GHz Low–Phase–Noise Voltage–Controlled Oscillator with Prescaler," 1995, pp. 1474–1482. No month.

Hung et al., "A 1.24–GHz Monolithic CMOS VCO with Phase Noise of 137 dBc/Hz at a 3–MHz Offset," 1999, pp. 111–113. No month.

Rudell et al., "A 1.9–GHz Wide–Band IF Double Conversion CMOS Receiver for Cordless Telephone Applications," 1997, pp. 2071–2088. No month.

Lin et al., "TP 12.5: A 1.4 GHz Differential Low–Noise CMOS Frequency Synthesizer using a Wideband PLL Architecture", 2000, pp. 204–205, 458. No month.

Gray, et al., Analysis and Design of Analog Integrated Circuits, pp. 270 & 274. No. date.

Gray et al., Analyss and Design of Analog Integrated Circuits, Fourth Edition, pp. 217–221. No date.

Dally, et al., "Digital Systems Engineering", cover and pp. 390–391 no date.

Sedra, et al., Microelectronic Circuits, 3rd Edition, 1991. No month.

U.S. Appl. No. 09/920,240, Roo, filed Aug. 1, 2001.

U.S. Appl. No. 09/737,743, Sutardja, filed Dec. 18, 2000.

Dunning, Jim, "An All–Digital Phase–Locked Loop with 50–Cycle Lock Time Suitable for High–Performance Microprocessors," IEEE Journal of Solid–State Circuits, vol. 30, No. 4, Apr. 1995, pp. 412–422.

Maneatis, John G., "FA 8.1: Low–JItter and Process–Independent DLL and PLL Based on Self–Biased Techniques" no date.

Moon, Yongsam, et al., "An All–Analog Multiphase Delay–Locked Loop Using a Replica Delay Line for Wide–Range Operation and Low–Jitter Performance, "IEEE Journal of Solid–State Circuits, vol. 35, No. 3, Mar. 2000, pp. 377–384.

* cited by examiner

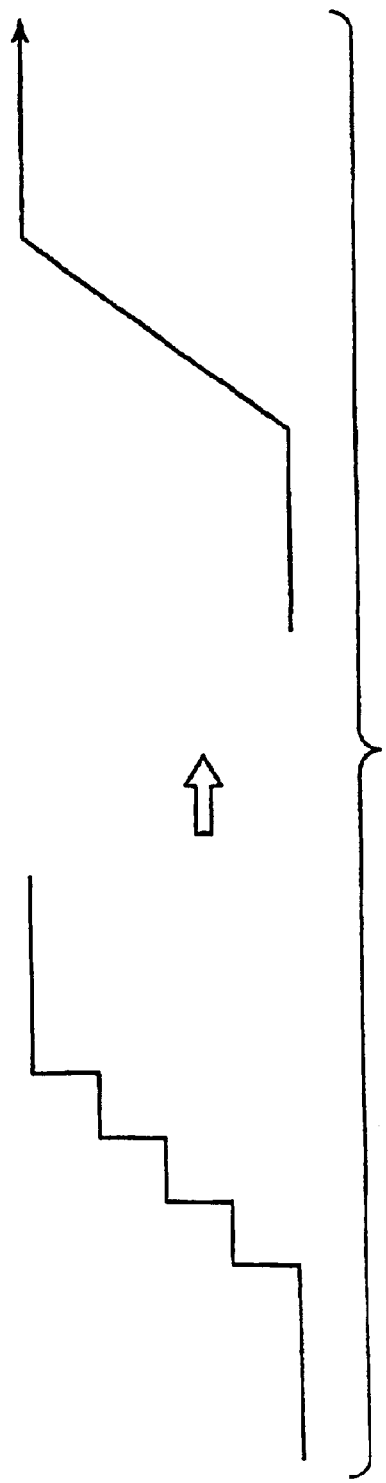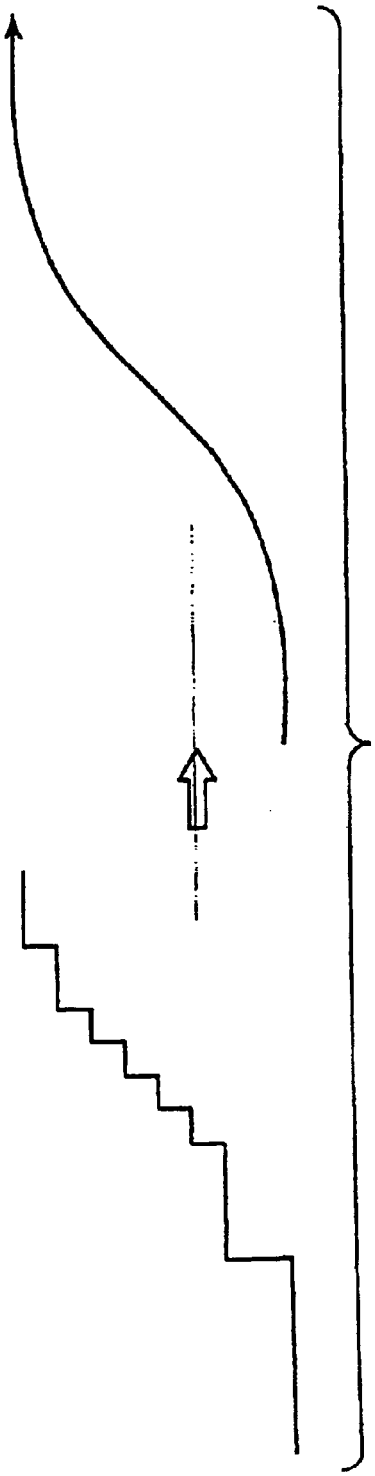

COMMUNICATION DRIVER

CROSS-REFERENCE TO RELATED APPLICATIONS

This application is a continuation of U.S. Non-Provisional patent application Ser. No. 10/191,924 entitled "Class B Driver," filed Jul. 8, 2002 (now U.S. Pat. No. 6,844,837), which is a continuation-in-part of U.S. Non-Provisional patent application Ser. No. 09/920,241 entitled "Apparatus And Method For Converting Single-Ended Signals To A Differential Signal, And A Transceiver Employing Same," filed Aug. 1, 2001, and U.S. Non-Provisional patent application Ser. No. 09/737,474 entitled "Direct Drive Programmable Class A and B High Speed Power Digital-To-Analog Converter," filed Dec. 18, 2000 (now U.S. Pat. No. 6,462,688), the entire contents of each which are incorporated by reference herein. This application is also a continuation-in-part of U.S. Non-Provisional patent application Ser. No. 09/737,743, filed Dec. 18, 2000, which claims priority under 35 U.S.C. §119(e) to U.S. Provisional Application Ser. No. 60/206,409, filed May 23, 2000, and to U.S. Provisional Application Ser. No. 60/211,571, filed Jun. 15, 2000. This application is also a continuation-in-part of U.S. patent application Ser. No. 09/629,092, filed Jul. 31, 2000 now U.S. Pat. No. 6,775,529.

BACKGROUND

1. Field of the Invention

The present invention relates generally to data communication. More particularly, the present invention relates to a Class B line driver for communication channels such as those present in an Ethernet network.

2. Background Information

Digital-to-analog conversion involves the process of converting digital codes into a continuous range of analog signal levels (voltage or current), for example, as discussed in Chapter 31, "D/A and A/D Converters" of The Electrical Engineering Handbook, ed. Richard C. Dorf, CRC Press 1993, the contents of which are hereby incorporated by reference. A digital-to-analog converter (hereinafter a DAC) is generally an electronic circuit that receives an n-bit codeword from an interface and generates an analog voltage or current that is proportional to the codeword.

One example of a DAC is discussed in U.S. Pat. No. 5,663,728, entitled A Digital-To-Analog Converter (DAC) and Method that set Waveform Rise and Fall Times to Produce an Analog Waveform that Approximates a Piecewise Linear Waveform to Reduce Spectral Distortion, issued on Sep. 2, 1997, the contents of which are hereby incorporated by reference. The DAC of the U.S. Pat. No. 5,663,728 patent employs a waveform shaping circuit to control the rise and fall times of each component waveform so that the analog waveform rising and falling edges settle to within a desired error bound of a linear output ramp.

U.S. Pat. No. 5,936,450, entitled A Waveshaping Circuit Using Digitally Controlled Weighted Current Summing, issued on Aug. 10, 1999, the contents of which are hereby incorporated by reference, discloses a waveshaping circuit. The waveshaping circuit of the U.S. Pat. No. 5,936,450 patent includes a controller and a current summing circuit controlled by the controller. The current summing circuitry selectively sinks combinations of component currents in response to a sequence of control signal sets to generate an output current signal having a desired waveform.

Many DACs attempt to generate desired signal waveform in response to a digital signal. For the purposes of this discussion, a signal output may include the output of a DAC and/or the output of one or more signal components within a DAC. For example, a signal component may correspond to an individual bit of a codeword. One conventional method generates a signal output with a slew rate controlled current source, as shown in FIG. 1. The voltage V measured across a resistor R is shown in FIG. 2. The waveform V includes sharp transition areas (e.g., corners) 1, 2 and 3, which may introduce electromagnetic interference. Such interference may inhibit accurate signal processing.

Another circuit which generates an output signal employs a current mirror 10 having an RC filter, as illustrated in FIG. 3. A current source I drives the current mirror 10. Current mirror 10 includes a first transistor 11 and a second transistor 12. Transistors 11 and 12 are preferably CMOS transistors. The first transistor 11 includes gate-to-drain feedback, and is coupled to transistors 12 through the RC filter. The RC filter limits rise and fall times of the input signal I. However, the R and C components are typically process and/or temperature dependent Such dependence causes variation in the output waveform as shown in FIG. 4. The dashed lines in FIG. 4 represent arbitrary output responses due to temperature and/or process variation A stable output signal is difficult to obtain with such a circuit.

Many older communications technologies employ bi-level signals, where each signal can have one of only two levels. However, newer communications technologies employ signals having many levels. One such technology, Gigabit Ethernet, employs signals having 17 levels. FIG. 5 depicts a D/A circuit capable of producing such multi-level signals. The D/A circuit of FIG. 5 employs a DAC 32, a low pass filter 34, an operational amplifier 36, a transistor 38, and a resistor 39. Each level of a multilevel input signal is provided to DAC 32 for conversion to an analog signal. The LPF 34 then determines the rise time of the output of the DAC 32, and the output is passed to operational amplifier 36. This construction presents two problems. First, the R and C values of LPF 34 will vary with temperature and process variations, and the output signal will have a poor waveshape where the rise times are not constant. Second, since all input current is passed through the same DAC, and since bandwidth is a function of current level, each level of the multilevel signal will present a different rise time. This second problem is illustrated in FIG. 24.

FIG. 24 shows a waveform produced by the D/A circuit of FIG. 5 where DAC 32 has four levels. Because the bandwidth of the circuit is a function of the signal level provided to the non-inverting input of operational amplifier 36, the slew rate differs for each signal level. Referring to FIG. 24 for example, the bandwidth for the transition from the 0 signal level to the 1 signal level is low, resulting in a low slew rate and a long rise time $t_1$. In contrast, the bandwidth for the transition from the 2 signal level to the 3 signal level is high, resulting in a high slew rate and a short rise time $t_2$.

These signal processing problems are not adequately addressed in the art. Accordingly, there is a need for a current source to control an output signal which is independent of temperature and process considerations. There is also a need for a DAC to generate a signal having selectable transition areas (comers). There is a further need of a circuit to generate desirable waveshapes.

SUMMARY OF THE INVENTION

In general, in one aspect, the invention features a communication circuit, Ethernet controller card, and method. It comprises a digital-to-analog converter to receive a digital control signal, and to provide an analog control signal, the digital-to-analog converter comprising N current sources configured in a parallel arrangement, wherein N is at least two, and wherein each of the N current sources includes a respective control input, M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the digital control signal, and wherein the analog control signal comprises the sum of the outputs of the N current sources; and a voltage-to-current converter to provide a transmit signal based on the analog control signal.

Particular implementations can include one or more of the following features. The M delay elements comprise at least one delay lock loop. The transmit signal is a Class B signal. Implementations can comprise a low-pass filter to receive the analog control signal, and to provide a filtered analog control signal to the voltage-to-current converter. The low-pass filter can comprise a single-pole filter. The voltage-to-current converter provides a replica of the transmit signal. Implementations can comprise a first sub-circuit having a composite input to receive a differential composite signal comprising the transmit signal, a replica input to receive a differential replica signal comprising the replica of the transmit signal, and a difference output to provide a differential difference signal representing a difference between the differential composite signal and the differential replica signal; a second subcircuit which produces first and second single-ended replica signals which together substantially comprise the differential replica signal; and a third sub-circuit, which is coupled to the first and second sub-circuits, and which produces the differential replica signal from the first and second single-ended replica signals. The voltage-to-current converter comprises a voltage buffer. The communication circuit operates at up to gigabit speeds.

In general, in one aspect, the invention features a communication circuit, Ethernet controller card, and method. It comprises K digital-to-analog converters each receiving a corresponding digital control signal and each providing a corresponding analog control signal, wherein K is at least two; K voltage-to-current converters each providing a corresponding bi-level transmit signal component in accordance with a respective one of the corresponding analog control signals; and wherein the corresponding bi-level transmit signal components of each of the K voltage-to-current converters are combined to produce a J-level transmit signal, wherein J=K+1.

Particular implementations can include one or more of the following features. The J-level transmit signal is a Class B signal. Each of the K digital-to-analog converters comprises N current sources configured in a parallel arrangement, wherein N is at least two, and wherein each of the N current sources includes a respective control input; M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the corresponding digital control signal. The M delay elements comprise at least one delay lock loop. The K voltage-to-current converters provide a replica of the J-level transmit signal. The replica of the transmit signal comprises first and second single-ended replica signals, further comprising a first sub-circuit which produces a differential replica signal from the first and second single-ended replica signals; and a second sub-circuit coupled to the first sub-circuit and the voltage-to current converters and having a composite input to receive a differential composite signal comprising the transmit signal, a replica input to receive the differential replica signal, and a difference output to provide a differential difference signal representing a difference between the differential composite signal and the differential replica signal. Each of the K voltage-to-current converters comprises a voltage buffer. The communication circuit operates at up to gigabit speeds.

In general, in one aspect, the invention features a communication circuit, Ethernet controller card, and method. It comprises K digital-to-analog converters each receiving a corresponding digital control signal and each providing a corresponding transmit signal component, wherein K is at least two, and wherein at least one each of the K digital-to-analog converters comprises N current sources configured in a parallel arrangement, wherein N is at least two, and wherein each of the N current sources includes a respective control input, M delay elements, an mth one of the M delay elements including an input in communication with an m−1th one of the M delay elements, wherein M is equal to N−1, wherein an output of the mth one of the M delay elements is arranged in communication with the control input of an m+1th one of the N current sources, wherein an input of a first one of the M delay elements receives the corresponding digital control signal, and wherein the corresponding transmit signal component comprises the sum of the outputs of the N current sources; and wherein the corresponding transmit signal components of each of the K digital-to-analog converters are combined to produce a J-level transmit signal, wherein J=K+1.

Particular implementations can include one or more of the following features. The M delay elements comprise at least one delay lock loop. The J-level transmit signal is a Class B signal. Implementations can comprise L digital-to-analog converters each receiving the corresponding digital control signal and each providing a corresponding replica transmit signal component, wherein L=K; and wherein the corresponding further replica transmit signal components of each of the L digital-to-analog converters are combined to produce a J-level replica transmit signal. The communication circuit operates at up to gigabit speeds.

The details of one or more implementations are set forth in the accompanying drawings and the description below. Other features will be apparent from the description and drawings, and from the claims.

BRIEF DESCRIPTION OF THE DRAWINGS

FIG. 15a is a graphical depiction of a waveform generated with uniform delay elements.

FIG. 15b is a graphical depiction of a waveform generated with non-uniform delay elements.

DETAILED DESCRIPTION OF THE PREFERRED EMBODIMENTS

The present invention will be described with respect to circuits and methods for shaping waveforms, and in particular, to a digital-to-analog converter (DAC) employing such a waveshaping circuit. However, as will be appreciated by those skilled in the art, the present invention is not limited to applications involving DACs, but also may be applied to other applications, such as signal processing, systems to control signal rise/fall time, signal storage, communications, etc. Moreover, while the present invention is particularly suited to applications in the read channel of a hard disk drive, many other applications will suggest themselves to persons of skill in the electrical engineering arts. Furthermore, the present invention is particularly suitable for use with the structure described in U.S. patent application Ser. No. 09/737,743, entitled "Active Replica Transformer Hybrid" filed concurrently herewith, the contents of which are incorporated herein by reference.

Figure 6:
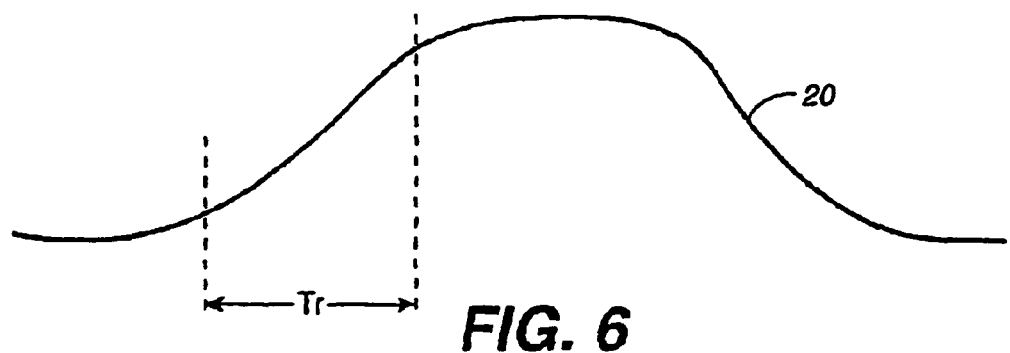
FIG. 6 is a graphical depiction of a waveshape having smooth transition areas.

FIG. 6 illustrates a desired signal output 20. The output waveform 20 includes smooth transition areas, which reduce noise such as electromagnetic interference. A preferred rise time ("$T_r$") for a DAC is 3–5 nanoseconds (ns).

Figure 7:
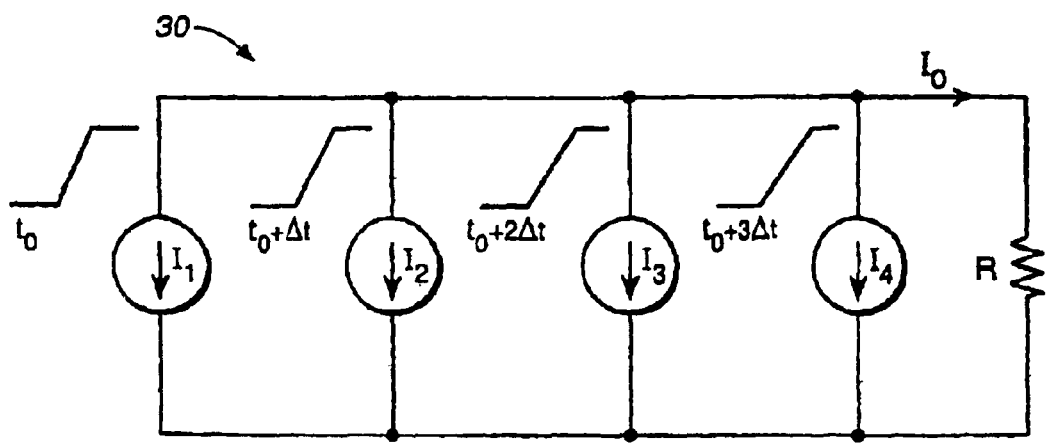
FIG. 7 is a circuit diagram of a current source according to the present invention.
Figure 8:
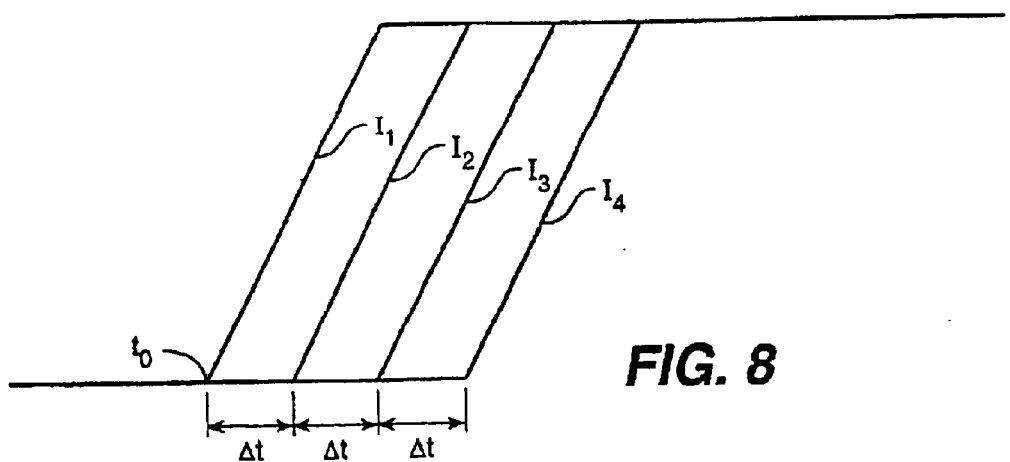
FIG. 8 is a graphical depiction of current components of the current source illustrated in FIG. 6.

The present invention generates a signal to approximate the desired signal output 20 with a current source 30. As shown in FIG. 7, current source 30 includes a plurality of current sources. For example, current source 30 may include current sources $I_1$, $I_2$, $I_3$ and $I_4$. Current sources $I_1$, $I_2$, $I_3$ and $I_4$ each preferably generate a respective current $I_n$, where n is 1, 2, 3 or so forth. The signals $I_n$ are preferably equal in magnitude and form, and may include a signal delay. In the FIG. 7 example, current sources $I_n$ each generate a linear ramp. For example, consider a signal I1, which includes a linearly rising edge starting at time t0. Current I2 mirrors current I1, except that I2 includes a linearly rising edge starting at time t0+Δt. The variable Δt represents an amount of delay time. Current I3 mirrors currents I1 and I2, except that current I3 includes a linearly rising edge starting at time t0+2Δt. Similarly, current I4 mirrors currents I1, I2, and I3, except that its linearly rising edge starts at time t0+3Δt. The relative waveform components for currents $I_1$, $I_2$, $I_3$ and $I_4$ are shown in FIG. 8.

Figure 9:
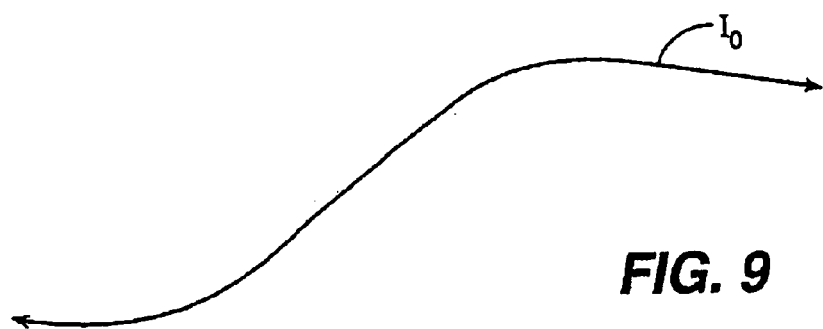
FIG. 9 is a graphical depiction of a resultant output waveshape from the current source illustrated in FIGS. 6 and 7.

Currents $I_1$, $I_2$, $I_3$ and $I_4$ are summed (or mixed) to produce a resultant waveform I0 as shown in FIG. 9. Waveform I0 approximates the desired output signal shown in FIG. 6. Like the desired output signal of FIG. 6, waveform I0 has many desirable properties. For example, I0 has selectable transition areas (corners). The transition areas can be smooth, or sharp, by selectively adjusting the length of Δt. Also, waveform I0 accommodates arbitrary rise/fall times.

Figure 10:
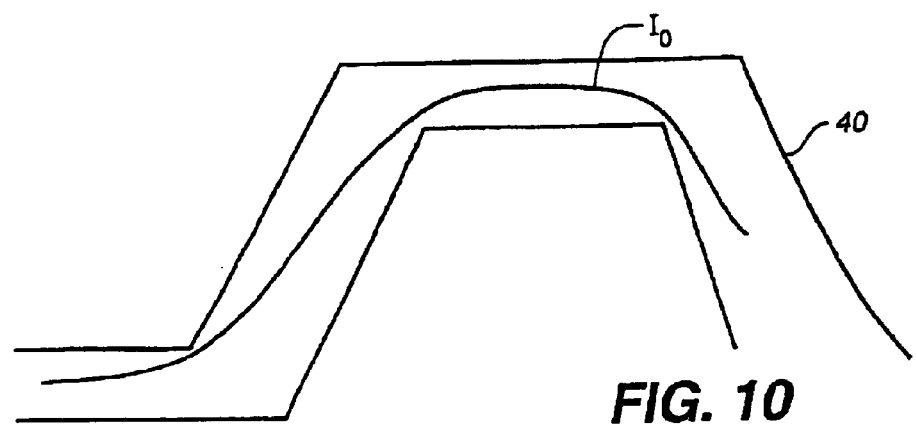
FIG. 10 is a graphical depiction of a waveform template, and a waveshape that fits within the template.

The waveform I0 can also be adjusted by varying Δt to fit within specified requirements. For example, with reference to FIG. 10, waveform I0 can be adjusted to fit within a template 40, for example, as provided by the IEEE standard waveform shape. In this example, I0 has been optimized to produce low electromagnetic interference and to fit within the IEEE template 40.

The delay variable Δt is preferably controlled using a delay-locked loop or is controlled by reference to an external clock. As such, Δt can be precisely regulated. A waveform which is independent of temperature and/or process considerations can then be generated.

The generation of a linear ramp is explained with reference to FIGS. 11–13. A signal is produced from current source 50, which includes a plurality of current sources I1 through In. Each of the plurality of current sources generates a replica signal I. In this example, input signal I is preferably a square waveform. The signal I is delayed by Δt from each subsequent current source, after the initial current source I1. For example, I2 is delayed by Δt, and In is delayed by nΔt. The currents are summed (or mixed) in a known manner to produce an output which approximates a linear ramp.

Figure 12A:
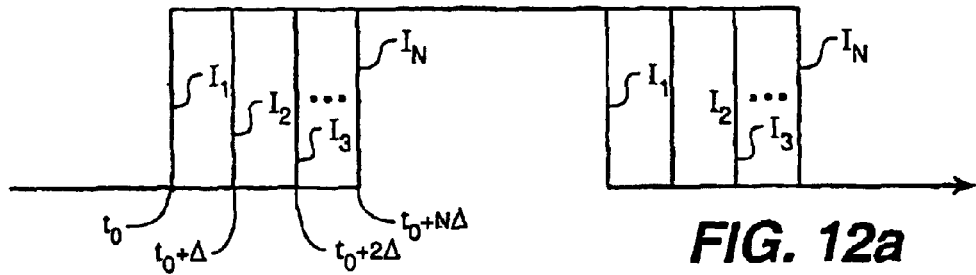
FIGS. 12a–12c are graphical depictions of waveshapes generated by the current source of FIG. 10.
Figure 12B:
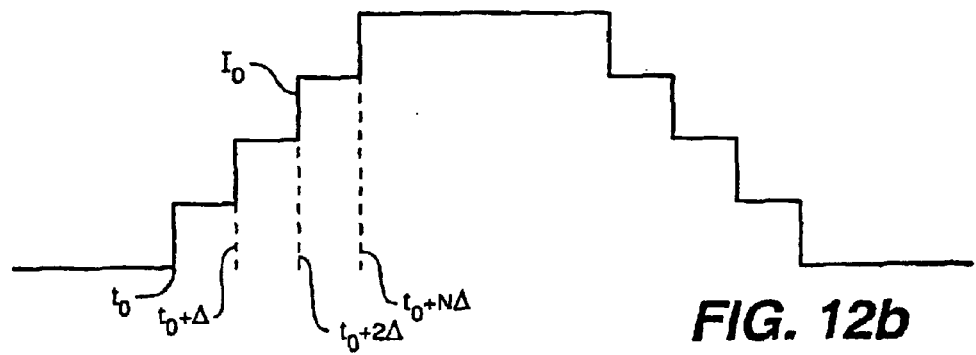
Figure 12C:
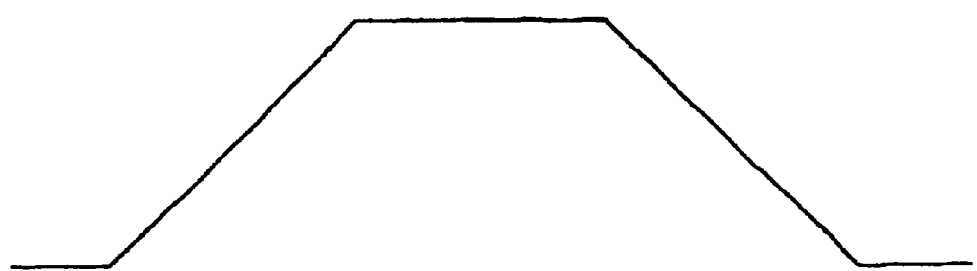

With reference to FIG. 12a, the signal components of the individual current sources are relatively illustrated. FIG. 12b illustrates the resultant waveshape I0, which includes a stair-step pattern. A linear ramp, as shown in FIG. 12c, is approximated as the length of the delay variable Δt is decreased.

Figure 13:
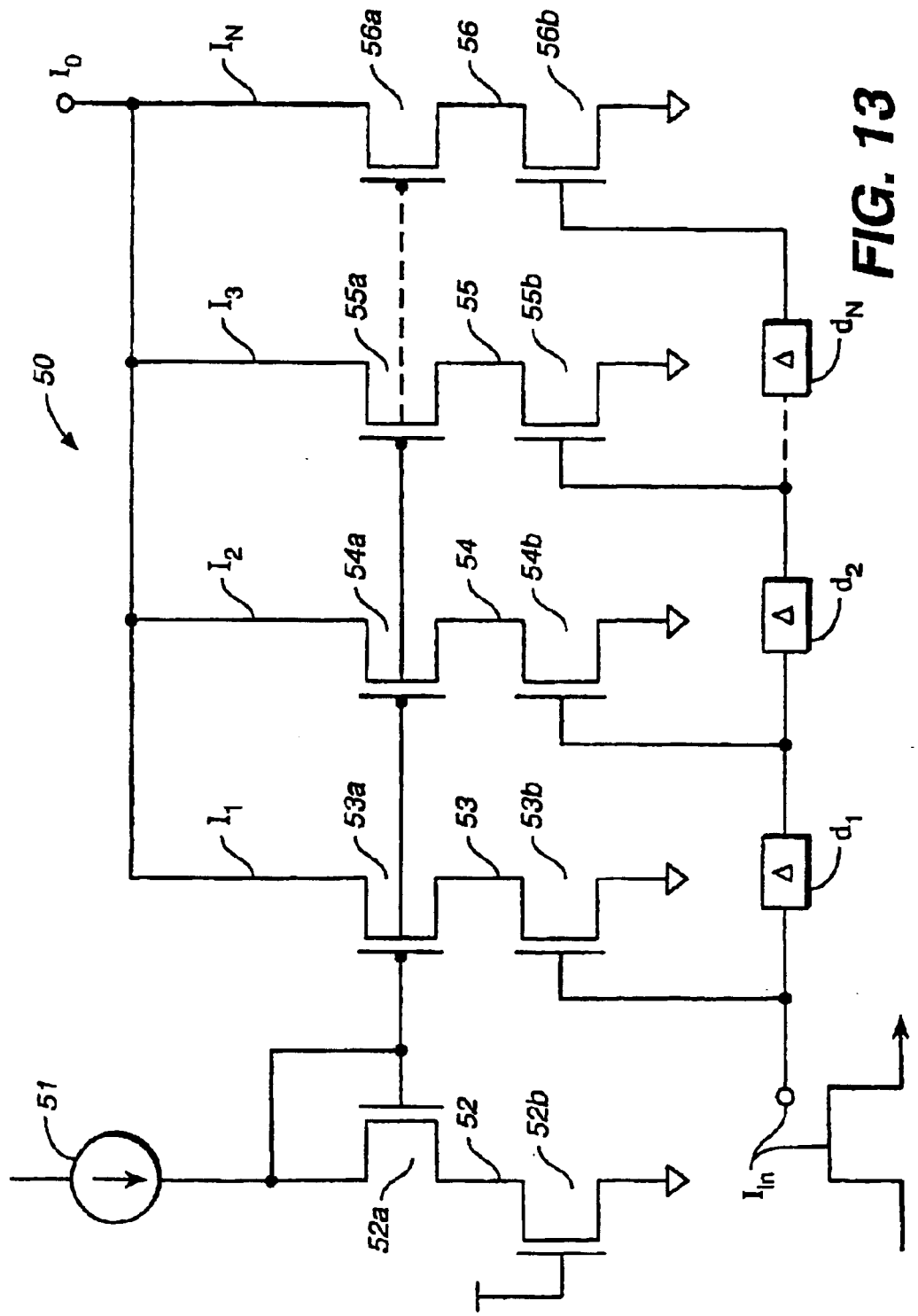
FIG. 13 is a circuit diagram of a current source according to the present invention.

A circuit diagram of the current source 50 is shown in FIG. 13. Current source 50 includes a plurality of transistor pairs 52–56, where pair 56 represents the nth transistor pair. With reference to FIG. 13, a current source 51 drives transistor pair 52. Transistor pair 52 includes a transistor 52a communicating with a transistor 52b. Transistor 52a is preferably configured with gate-to-drain feedback. The gate of transistor 52b is biased so as to operate in an "on" state. The gate/drain of transistor 52a communicates with the gates of transistors 53a, 54a, 55a and 56a. The drains of transistors 53a–56a each communicates with an output Io. The gates of transistors 53b–56b each communicates with an input waveform Iin (e.g., a square signal), some through delay elements. For example, the gate of transistor 54b communicates with waveform Iin through delay element d1. The gate of transistor 55b communicates with waveform Iin through delay element d2 and delay element d1. Similarly, the gate of transistor 56b communicates with waveform Iin through each of the delay elements d1 through dn. In the preferred embodiment, each of delay elements d1-dn delays the signal by Δ. Delay elements can be realized via known delay locked loops.

The operational aspects of FIG. 13 are now even further explained. Initially, waveform Iin is communicated to the gate of transistor 53b, which turns on the transistor pair 53. A signal I1, which is proportional to the waveform Iin, is output at Io. Waveform Iin is also communicated to delay element d1, which delays the waveform by Δ seconds. After Δ seconds, delay element d1 communicates the delayed waveform to the gate of 54b, which turns on the transistor pair 54. A signal I2, which is proportional to Iin, is output at Io. The resultant waveform Io includes the sum (or mixture) of signals I1 and I2. The input waveform Iin is respectively delayed before communicating with the gates of transistors 55b and 56b. Transistor pairs 55 and 56 are activated (e.g., turned on) and respectively supply current I3 and In, which are added to the resultant waveform I. The current source 50, as shown in FIG. 11, is therefore realized.

Figure 1:
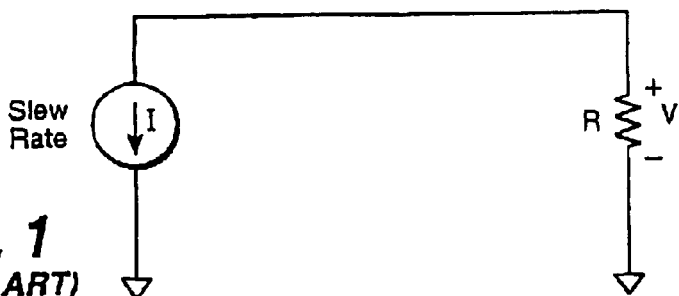
FIG. 1 is a diagram of a conventional circuit, which includes a slew rate controlled current source.
Figure 2:
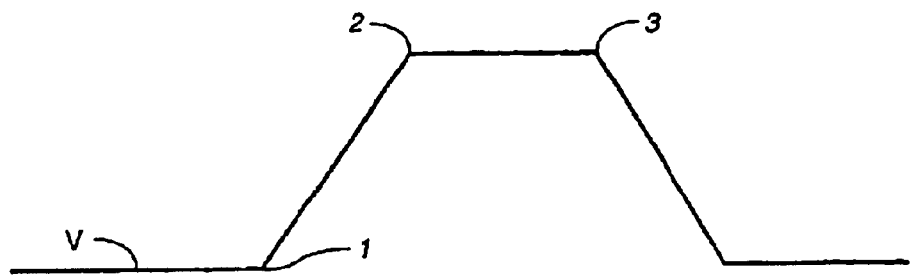
FIG. 2 is a graphical depiction of a waveshape corresponding to an output of the FIG. 1 circuit.
Figure 3:
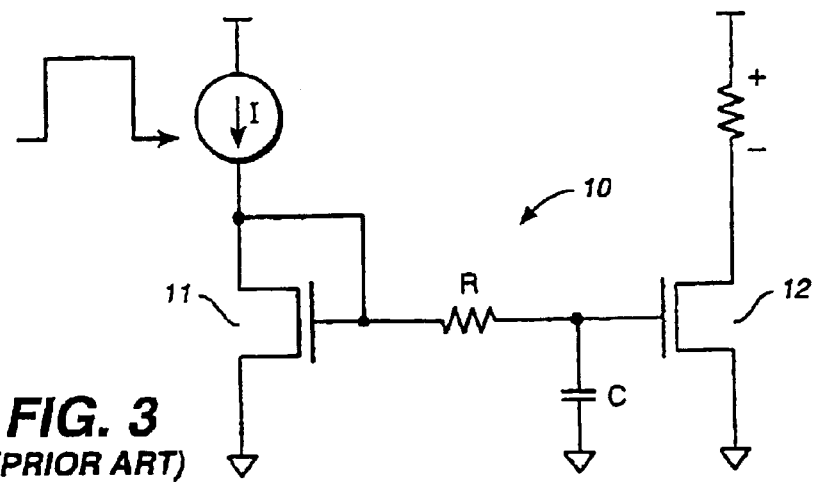
FIG. 3 is a view of a conventional circuit including a current mirror having an RC filter.
Figure 4:
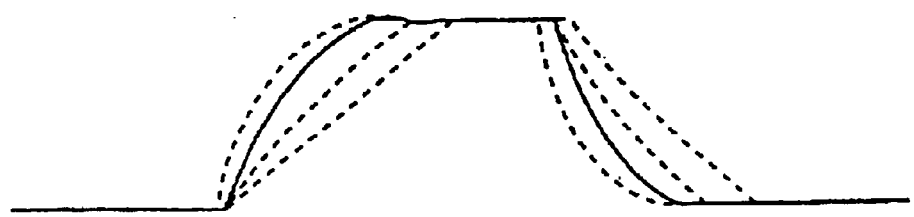
FIG. 4 is a graphical depiction of a waveshape corresponding to an output of the FIG. 3 circuit.
Figure 5:
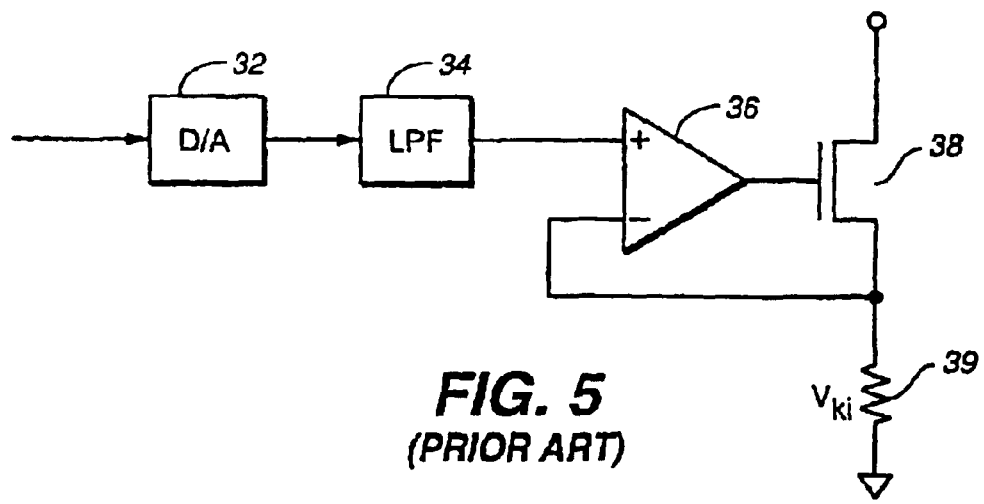
FIG. 5 is a schematic block diagram of a D/A circuit.
Figure 11:
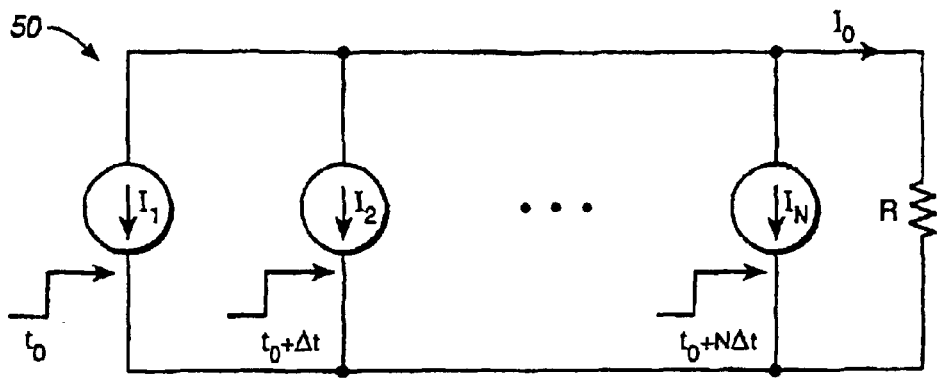
FIG. 11 is a circuit diagram of a current source according to the present invention.

There are many advantages of the configurations shown in FIGS. 11 and 13. For example, individual current sources (e.g., In) can be turned on/off on demand, particularly since Vgs is large and constant. Also, the current source 50 will generally consume less power than the current mirror shown in FIG. 3, particularly since a current mirror typically employs a DC bias. An additional advantage is that with a small Iin, the VGS voltage is also small (e.g., close to the threshold voltage VT). In such a case, VGS−VT−VDS equals a small number of current sources with negative VDS.

Figure 14:
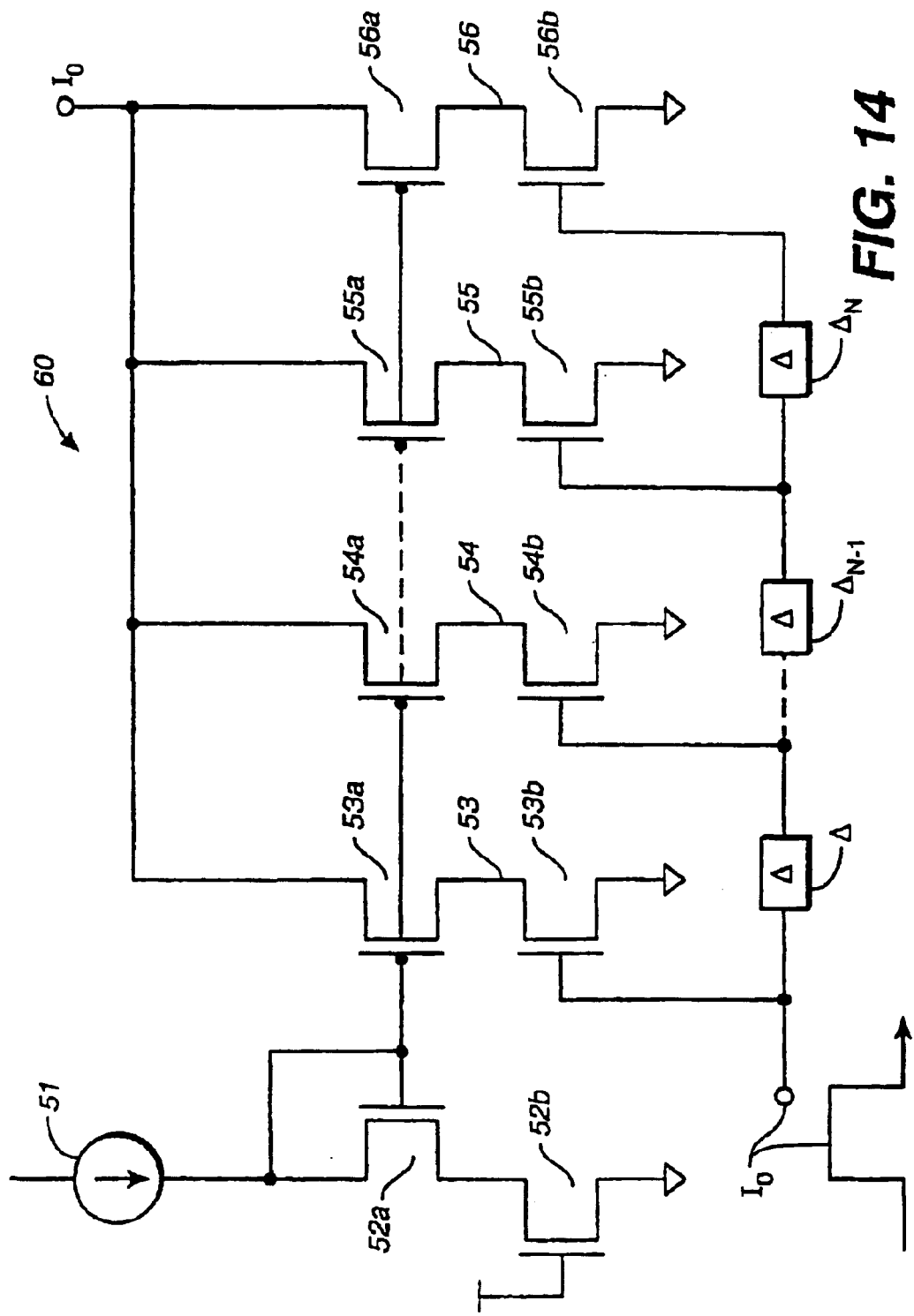
FIG. 14 is a circuit diagram of a current source having variable delay elements according to the present invention.

A further current source 60 is shown in FIG. 14. The current source 60 is configured in the same manner as the current source 50 shown in FIG. 13, except that the delay elements may include variable delays. The same components with respect to FIG. 13 are labeled with their same reference numerals in FIG. 14. In the FIG. 14 embodiment, delay elements A are non-uniform throughout the circuit. For example, Δmay involve a longer delay than Δn−1, and so forth. Non-uniform delays may be employed to generate a smooth waveform. Multiple delay-locked-loops are preferably used to achieve different delay times.

To illustrate, an output waveform processed with uniform delay elements is shown in FIG. 15a. Here a stair step waveform is produced, which may approximate a linear ramp, particularly as the variable Δ is decreased in length (e.g., time). In contrast, the amount of delay is varied with respect to individual delay elements as shown in FIG. 15b. The approximated waveshape of FIG. 15b is smooth (e.g., includes smooth transition areas) in comparison to the approximated linear waveshape of FIG. 15b. Eight steps (or corresponding current sources) are employed in a preferred embodiment for a Gigabit channel. Of course, the number of levels may be varied according to need or design without deviating from the scope of the present invention.

Figure 16:
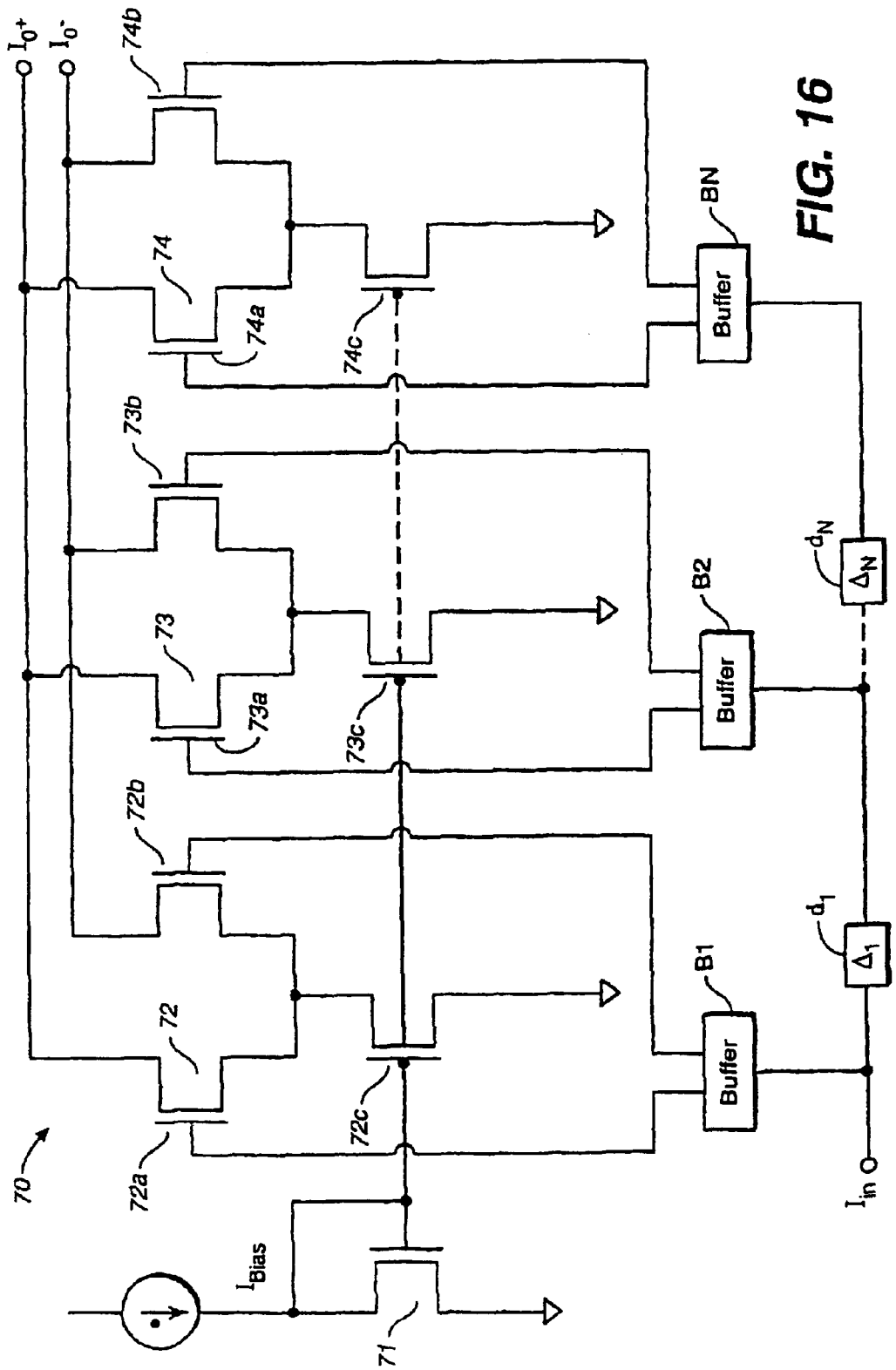
FIG. 16 is a circuit diagram of a current source including a plurality of differential transistor pairs according to the present invention.

A further embodiment of a current source is illustrated in FIG. 16. The illustrated current source 70 includes a plurality of differential transistor pairs 72–74, where 74 represents the nth differential transistor pair. A bias current $I_B$ is supplied to the gate of transistors 72c, 73c and 74c. An input waveform Iin is communicated to the gates of 72a, 72b, 73a, 73b, 74a and 74b. In the case of transistor pair 73 and 74, the input waveform Iin is delayed through delay elements d1 and d1+dn, respectively. Buffers B1"BN are optionally included in the circuit 70 to buffer the input signal Iin. A differential output (Io+, Io−) is accordingly produced.

The advantages of the FIG. 16 current source include constant power dissipation. Also, the circuit provides matching capabilities, for example, for use in an Ethernet channel.

Figure 17:
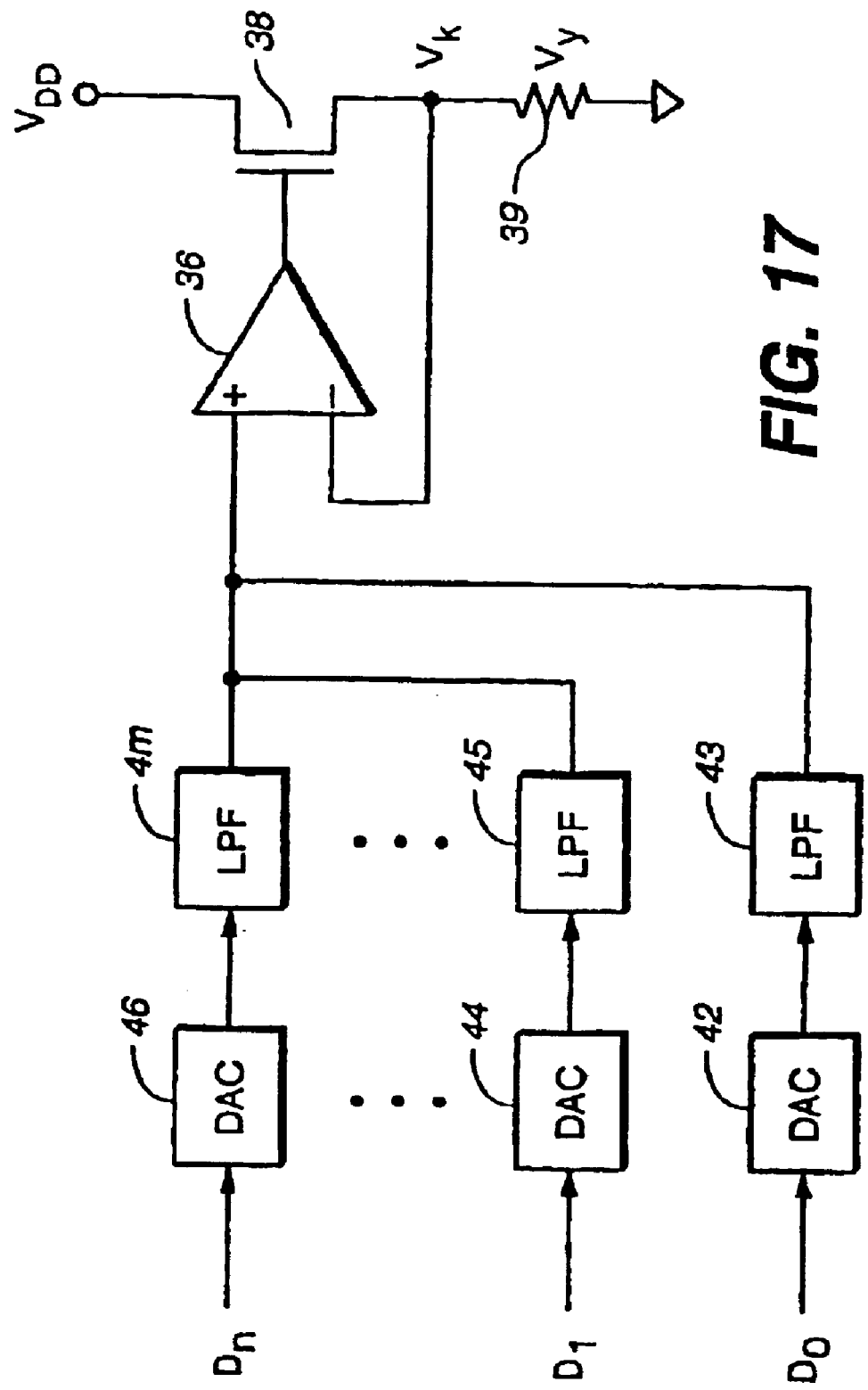
FIG. 17 is a circuit diagram of an alternative embodiment according to the present invention.

One drawback of the differential amplifier in FIG. 16 is that the differential amplifier is a Class A circuit which consumes unnecessary power even when no output is being transmitted. Moreover, a significant number of transistors is required to provide an adequately smoothed output current, thus requiring a large chip area. FIG. 17 depicts a schematic diagram of another embodiment according to the present invention which operates in Class B wherein one DAC is provided for each level of the multilevel input signal. DACs 42, 44, . . . 46 may be provided with corresponding LPFs 43, 45, 4m. Preferably, a circuit according to FIG. 13 supplies each DAC with a control current to provide a stair step output which defines the rise time. In such an embodiment, since each DAC receives control current, and not input current, the transistors which supply each DAC may be smaller than those used in the FIG. 13 embodiment. Additionally, since the control signal determines the rise time of the output of each DAC, the LPFs merely produce a smoother output.

In FIG. 17, multilevel input signal D0, D1, . . . Dn is provided to the parallel DACs 42, 44, . . . 46. The number of DACs may be varied depending on the application. This embodiment solves two problems. First, by providing the FIG. 17 circuit with a staircase waveform, for example, from FIG. 14, an LPF merely smoothes the staircase waveform rather than defines rise time. Second, since the DACs are disposed in parallel, there will be no variations in rise time because each DAC has substantially the same current passing therethrough; that is there will be no bandwidth variation with resultant differences in rise time. The DACs may also be controlled by any appropriate circuitry, such as a decoder disposed prior to the DACs which would, in effect, select which DACs are activated by proper application of the input signals. In an alternative arrangement, a resistor ladder may supply the multilevel signal to the DACs of FIG. 17 rather than the transistors depicted in FIG. 13.

In communication transceivers, and particularly in Ethernet transceivers which are capable of transmitting and receiving data at 1000 megabits bits per second, communication is possible in a full-duplex mode. In other words, transmitting and receiving of data can occur simultaneously on a single communication channel. Implementation of such a full-duplex communication channel results in a composite signal ($V_{TX}$) being present across the output terminals of the transceiver, the composite signal $V_{TX}$ having a differential transmission signal component and a differential receive signal component. In such a communication channel, the received signal ($V_{RCV}$) is derived by simply subtracting the transmitted signal ($V_T$) from the composite signal $V_{TX}$ that is present at the transceiver output terminals. Hence, $V_{RCV} = V_{TX} - V_T$.

This subtraction can be accomplished by generating a signal (referred to as a replica signal) which substantially replicates the transmitted signal, and canceling or subtracting the generated replica signal from the composite signal $V_{TX}$ at the output terminals of the transceiver. However, the replica signal is generated as two single-ended voltages, such as $V_{TXR+}$ and $V_{TXR-}$, whereas the composite signal present at the output terminals of the transceiver is a differential signal. Consequently, in order to cancel the replica signal from the composite signal to thereby obtain the received signal, the two single-ended voltage signals must first be converted to a differential signal that can then be subtracted from the composite signal. This conversion, however, requires additional circuitry which adds to the cost and complexity of the transceiver.

While the present invention will be described with respect to an Ethernet controller for use in general purpose computers, printers, routers, etc. it is to be understood that the present invention may find applicability in other fields such as Internet communications, telecommunications, or any processor-to-processor applications using full-duplex communication.

Figure 18:
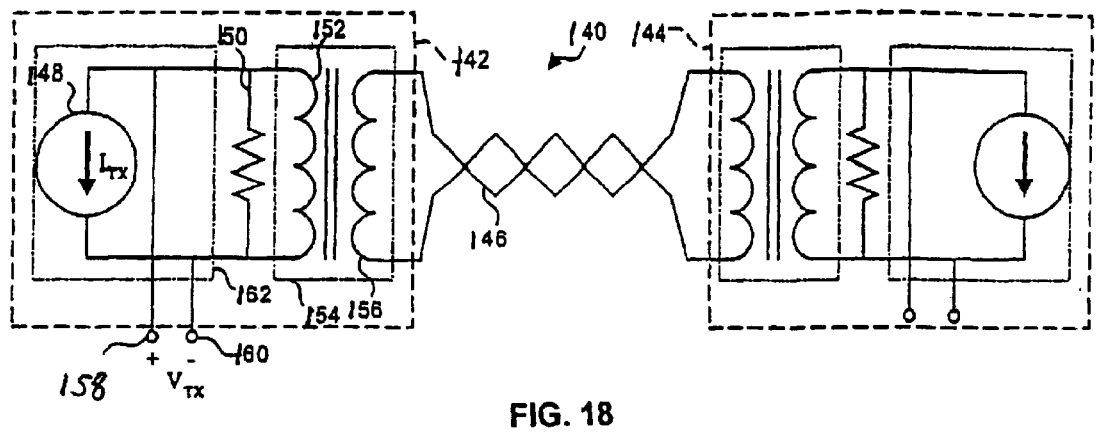
FIG. 18 is a high-level schematic diagram illustrating a communication channel in connection with which the method and apparatus of the present invention may be used.

Communication in an Ethernet computer network is illustrated in FIG. 18. As shown, an Ethernet communication channel 140 comprises a first Ethernet transceiver 142, a second Ethernet transceiver 144, and a two-wire interconnection 146 between the first Ethernet transceiver 142 and the second Ethernet transceiver 144. For example, the two-wire interconnection 146 may comprise a single twisted-pair of a Category 5 cable in accordance with IEEE gigabit transmission standard No. 802.3ab. As the Ethernet transceivers 142 and 144 may be substantially identical, only one of them is described herein.

The Ethernet transceiver 142 has a controlled current source 148, which is used to inject into the Ethernet transceiver 142 a control current $I_{TX}$, which corresponds to a signal to be transmitted from the Ethernet transceiver 142 to the Ethernet transceiver 144. Ethernet transceiver 142 also has a termination resistance 150 and a first coil 152 of a center-tap transformer 154. The center-tap transformer 154 also has a second coil 156 coupled to the two-wire interconnection 146 to provide signals transmitted by the first Ethernet transceiver 142 to the second Ethernet transceiver 144. The center-tap transformer 154 serves to couple AC voltage signals between the Ethernet transceivers 142 and 144 while effectively decoupling the Ethernet transceiver 142 from the Ethernet transceiver 144 with respect to DC voltage signals. A pair of terminals 158, 160 is provided to measure a voltage $V_{TX}$ present across the resistor 150 as a result of both signals transmitted by the Ethernet transceiver 142 and signals received by the Ethernet transceiver 142 from the Ethernet transceiver 144 via the two-wire interconnection 146. The voltage $V_{TX}$ thus comprises a composite differential signal that includes a differential transmission signal component and a differential receive signal component.

As described in more detail below, the differential receive signal component of the composite differential signal $V_{TX}$ is determined in accordance with the present invention by subtracting a replica of the differential transmission signal component from the composite differential signal $V_{TX}$. In the illustrated embodiment, the Ethernet transceiver 142 includes the termination resistance 150, the center-tap transformer 154, and an integrated circuit 162 containing communications circuitry for implementing the functionality of the Ethernet transceiver 142.

Figure 19:
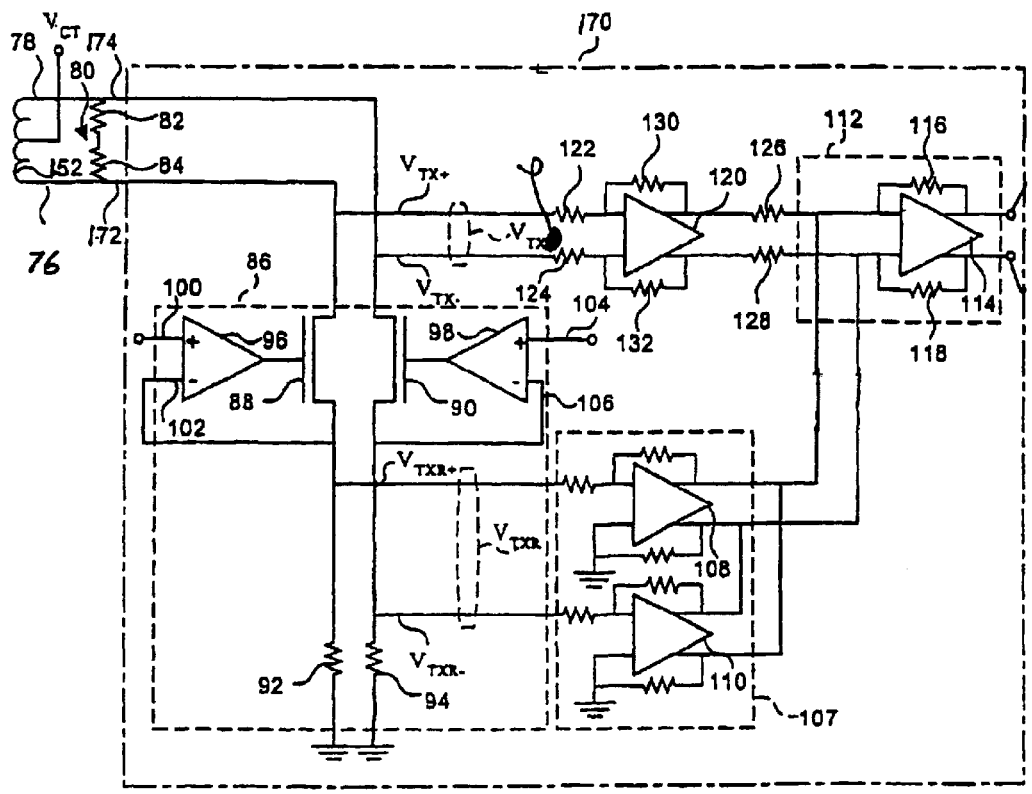
FIG. 19 is a detailed schematic diagram illustrating one embodiment of a transceiver according to the principles of the present invention.

An exemplary embodiment of such Ethernet transceiver communications circuitry is illustrated in the schematic of FIG. 19. As shown in FIG. 19, an integrated circuit 170 has a pair of output terminals 172, 174, which are coupled to terminals 76, 78, respectively, of the winding 152 of the center-tap transformer 154. Current in the winding 152 of the center-tap transformer 154 induces a proportional current in the secondary winding (not shown in FIG. 19) of the center-tap transformer 154, and that proportional current is communicated over the two-wire interconnection 146 (FIG. 18) to another Ethernet transceiver coupled thereto. Also coupled between the output terminals 172, 174 is a termination resistance 80, which, in the illustrated embodiment of FIG. 19, comprises a pair of termination resistors 82, 84. Preferably, the termination resistors 82, 84 have resistance values to substantially match the 100 ohm characteristic impedance of Category 5 cable in accordance with established standards for Ethernet connections.

The integrated circuit 170 also includes a transmission signal replicator 86 or other suitable circuitry for generating first and second single-ended replica transmission signals $V_{TXR+}$ and $V_{TXR-}$, which together substantially comprise a replica of the differential transmission component of the composite differential signal $V_{TX}$. In the illustrated embodiment, the transmission signal replicator 86 comprises a pair of metal-oxide semiconductor (MOS) transistors 88, 90.

The transistor 88 is coupled between the output terminal 172 and one end of a resistor 92, the other end of the resistor 92 being coupled to ground. Similarly, the transistor 90 is coupled between the output terminal 174 and one end of a resistor 94, the other end of which is coupled to ground The gate of each transistor 88, 90 is coupled to and driven by the output of a respective operational amplifier 96, 98. The operational amplifier 96 has a non-inverting input 100 and an inverting input 102. The inverting input 102 of the operational amplifier 96 receives a feedback signal from the junction of the source of the transistor 88 and the resistor 92. Likewise, the operational amplifier 98 has a non-inverting input 104 and an inverting input 106, which receives a feedback signal from the junction of the source of the transistor 90 and the resistor 94.

A differential control voltage signal is applied between the non-inverting input 100 of the operational amplifier 96 and the non-inverting input 104 of the operational amplifier 98. This differential control voltage signal, when subjected to the voltage-to-current conversion brought about by the transmission signal replicator 86, provides the differential transmit signal component at the output terminals 172, 174. The feedback signal to the inverting input 102 of the operational amplifier 96 comprises a first single-ended replica transmit signal $V_{TXR+}$, and the feedback signal to the inverting input 106 of the operational amplifier 98 comprises a second replica transmit signal $V_{TXR-}$.

The single-ended replica transmit signals $V_{TXR+}$ and $V_{TXR-}$ are converted to a differential replica transmit signal by a converter circuit 107, which comprises respective differential operational amplifiers 108, 110, each provided with suitable input and feedback resistors, as shown in FIG. 19. The outputs of the differential operational amplifiers 108 and 110 are coupled to a differential active summer 112, which, in the embodiment of FIG. 19, comprises a differential operational amplifier 114 with feedback resistors 116, 118.

Because the differential operational amplifiers 108 and 110 introduce a delay into the replica transmissions signals $V_{TXR+}$ and $V_{TXR-}$, the composite differential signal $V_{TX}$ is coupled to the differential active summer 112 through a further differential operational amplifier 120 arranged in a unity-gain configuration, with input resistors 122, 124, output resistors 126, 128, and feedback resistors 130, 132. This unity-gain operational amplifier simply provides a delay in the composite differential signal $V_{TX}$ which preferably substantially matches the delay introduced in the replica transmission signals $V_{TXR+}$ and $V_{TXR-}$ by the operational amplifiers 108 and 110. As will be readily appreciated by those of ordinary skill in the art, the various input, output, and feedback resistance values associated with the operational amplifiers 108, 110, and 120 may be selected to ensure that these delays are substantially equal to one another.

Figure 20:
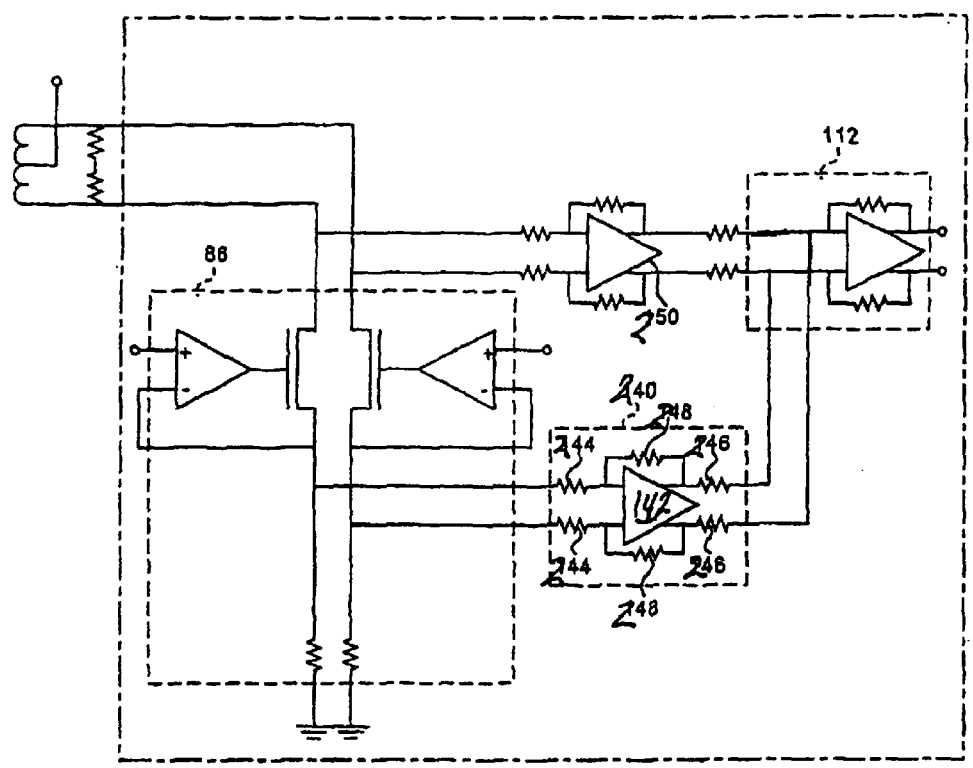
FIG. 20 is a detailed schematic diagram illustrating a second embodiment of a transceiver according to the principles of the present invention.

An alternative embodiment of a communications circuit in accordance with the present invention is shown in the schematic diagram of FIG. 20. Because the transmission signal replicator 86 and the differential active summer 112 in the embodiment of FIG. 20 are identical to those in the embodiment of FIG. 19, the details of those sub-circuits are omitted from the description of the embodiment of FIG. 20. The embodiment of FIG. 20, however, differs from the embodiment of FIG. 19 in the structure of the sub-circuit provided for converting the single-ended replica transmission signals $V_{TXR+}$ and $V_{TXR-}$ into a differential replica transmission signal $V_{TXR}$.

More particularly, as shown in FIG. 20, a converter circuit 240 is coupled to the transmission signal replicator 86 and to the differential active summer 112 to produce the differential replica transmission signal $V_{TXR}$ from the single-ended replica transmission signals $V_{TXR+}$ and $V_{TXR-}$. Converter circuit 240 includes an operational amplifier 242, input resistors 244, feedback resistors 248, and output resistors 246. Just as in the embodiment of FIG. 19, the embodiment of FIG. 20 includes a unity-gain differential operational amplifier 150, which provides a delay in the differential composite signal $V_{TX}$ to substantially match the delay introduced in the differential replica transmission signal $V_{TXR}$ by the converter circuit 240. As will be appreciated by those of ordinary skill in the art, the differential operational amplifier 150 is preferably provided with input, output, and feedback resistors having resistance values which give the differential operational amplifier 150 a unity-gain value. Accordingly, the differential active summer 112 receives as input the delayed differential composite signal $V_{TX}$ and the delayed differential replica transmission signal $V_{TXR}$ and subtracts the latter signal from the former to produce at an output of the differential active summer 112 a differential receive signal which comprises the composite differential signal minus the differential replica transmission signal and thus corresponds to the signal received by the transceiver 170.

The simplification of the converter circuit 240 in the embodiment of FIG. 20, compared to the converter circuit 107 in the embodiment of FIG. 19, is made possible by the fact that the single-ended replica transmission signals $V_{TXR+}$ and $V_{TXR-}$ produced by the transmission signal replicator 86 in the illustrated embodiment are characterized by the feature that when $V_{TXR+}$ is asserted then $V_{TXR-}$ is zero (or ground), and when $V_{TXR-}$ is asserted then $V_{TXR+}$ is zero (or ground). It is because the single-ended replica transmission signals $V_{TXR+}$ and $V_{TXR-}$ have this characteristic that the two differential operational amplifiers 108 and 110 of the converter circuit 107 in the embodiment of FIG. 19 can be replaced by the single differential operational amplifier 142 in the converter circuit 240 of the embodiment of FIG. 20.

This reduction in components in the converter circuit 240 provides not only substantial simplification of the integrated circuit 170 as a whole, but it also reduces the well-recognized manufacturing problem of component mismatch, such as between the two differential operational amplifiers 108 and 110 of the embodiment of FIG. 19, for example, and improves common-mode rejection, which, in turn, results in overall improved performance of the transceiver 142.

Figure 21:
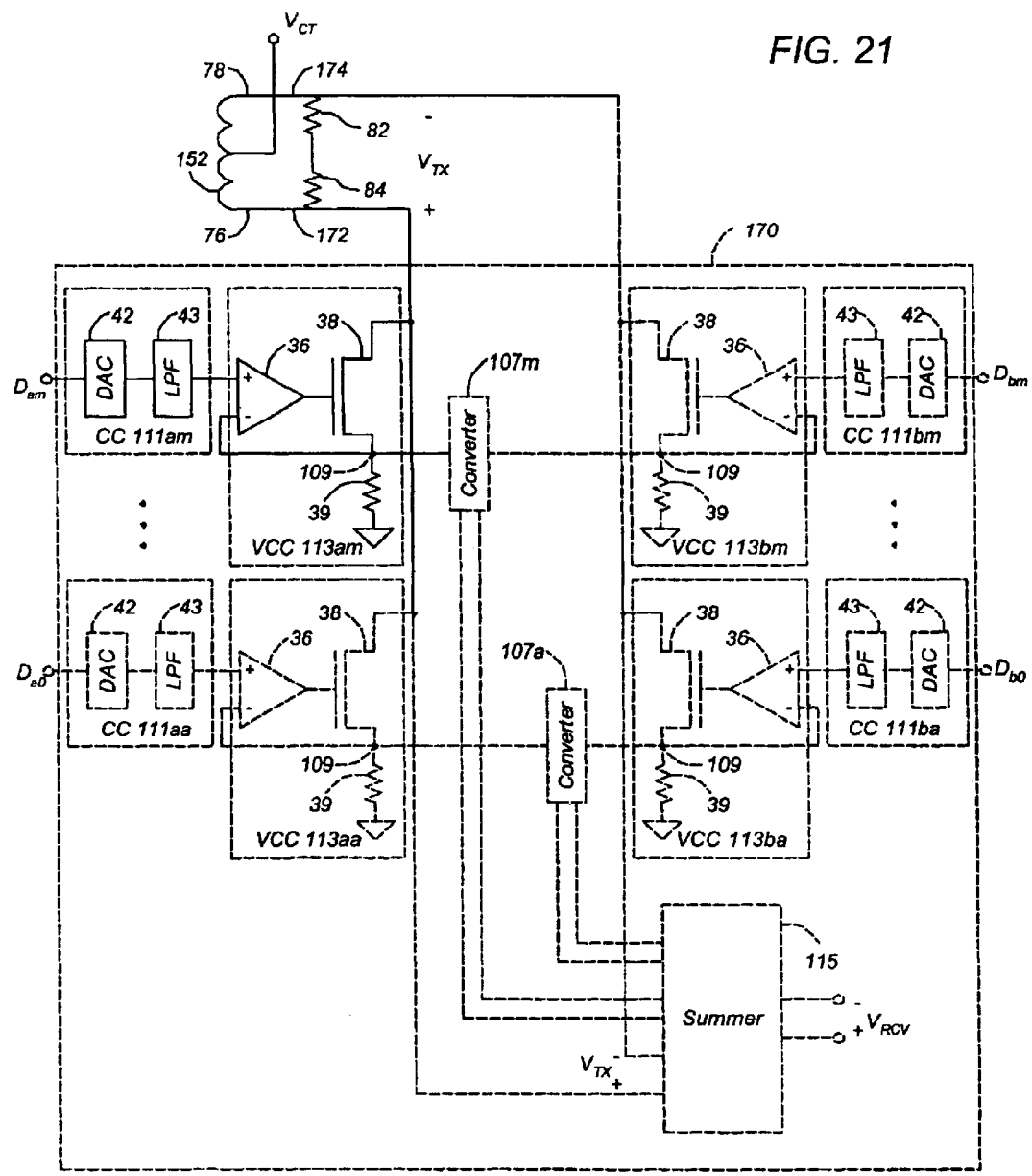
FIG. 21 is a detailed schematic diagram illustrating a third embodiment of a transceiver according to the principles of the present invention.

Another exemplary embodiment of Ethernet transceiver communications circuitry is illustrated in the schematic of FIG. 21. Referring to FIG. 21, integrated circuit 170 comprises m differential pairs of voltage-to-current converters (VCC) 113. In the preferred embodiment, each VCC 113 comprises a voltage buffer comprising an operational amplifier 36, a transistor 38, and a resistor 39. The inverting input of each operational amplifier 36 receives a feedback signal from a node 109 at the junction of the source of a transistor 38 and a resistor 39. The non-inverting input of each operational amplifier 36 receives a control signal generated by a control circuit (CC) 111 comprising a DAC 42 and an optional low-pass filter (LPF) 43 in response to a bit of a digital control signal D. An important feature is that DAC 42 determines the slew rate. In the preferred embodiment, LPF 43 can be implemented as a single-pole filter. Each VCC 113 generates a bi-level transmit signal component in response to the analog control signal. In a preferred embodiment for use with Gigabit Ethernet, integrated circuit 170 includes 8 differential pairs of VCCs, and so is capable of producing a 17-level signal.

The transmit signal components generated by VCCs 113aa through 113am are combined to provide a multi-level signal that forms a first polarity of differential transmit signal $V_T$, which appears at terminals 172, 174 as a component of composite signal $V_{TX}$. The transmit signal components generated by VCCs 113ba through 113bm are combined to provide a multi-level signal that forms a second polarity of signal $V_T$. Composite signal $V_{TX}$ is fed to a differential active summer 115, which can be implemented in a manner similar to summer 112 of FIG. 19. Summer 115 also receives replicas of the transmit signal components produced by each VCC 113.

Figure 24:
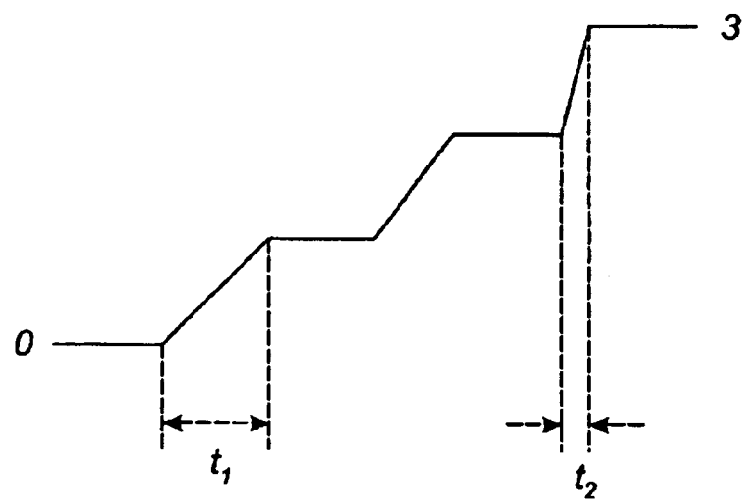
FIG. 24 shows a waveform produced by the D/A circuit of FIG. 5.
Figure 25:
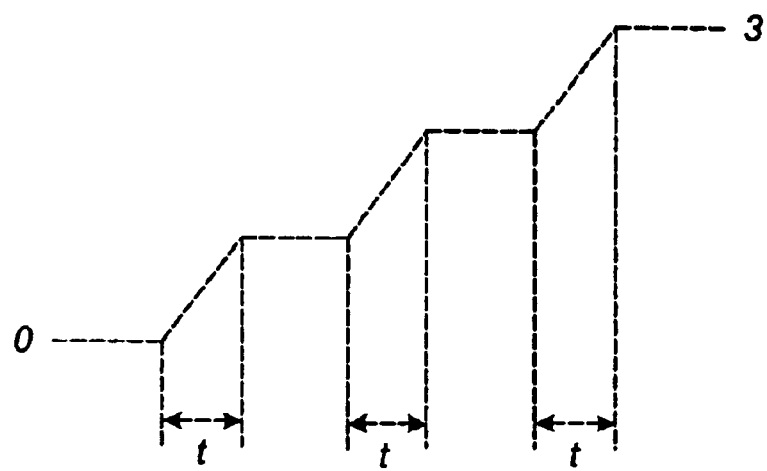
FIG. 25 shows a waveform produced by the circuit of FIG. 21.

One feature of the arrangement of FIG. 21 is that the transmit signal is free of the distortion shown in FIG. 24. FIG. 25 shows a waveform produced by the circuit of FIG. 21. Because each level of the transmit signal is generated independently by similar circuits, the slew rates are the same for each signal level. Consequently, as shown in FIG. 25, the rise time t for each signal level is the same.

Another feature of the arrangement of FIG. 21 is the provision of an accurate replica of the transmit signal components produced by the VCCs. In particular, referring to FIG. 21, the current that generates a replica of a transmit signal component at a node 109 is the very same current that generates the transmit signal component. Hence, the replica signal produced by a VCC 113 is unaffected by process and temperature variations, and so is a very accurate replica of the transmit signal component generated by that VCC 113. Further, because node 109 is a low-impedance node, the replica signal can be tapped at node 109 with very little disturbance to the transmit signal component.

For example VCC 113*am* is paired with VCC 113*bm*. Each VCC 113 in a differential pair provides a replica signal component to a converter 107, which can be implemented as shown in FIG. 19. For example, VCC 113*am* and VCC 113*bm* provide replica signal components to converter 107*m*. Each converter produces a differential replica signal component based on the single-ended signals received from the VCCs 113, and provides the differential replica signal components to summer 115. Summer 115 obtains the received signal $V_{RCV}$ by subtracting the differential replica signal components from the composite signal $V_{TX}$ that is present at the transceiver output terminals.

Figure 26:
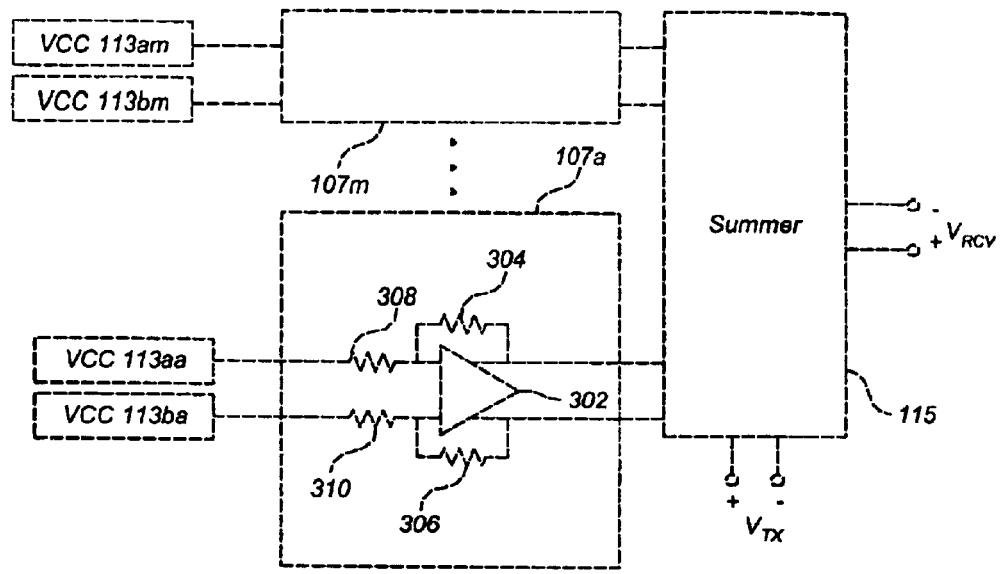
FIG. 26 shows detail of a converter according to one implementation.

FIG. 26 shows detail of a converter 107*a* according to one implementation. The outputs of VCCs 113*aa* and 113*ba* are coupled through resistors 308 and 310 to a differential operational amplifier 302 having feedback resistors 304 and 306. The outputs of differential operational amplifier 302 are supplied to summer 115. The remaining converters 107 are similarly implemented and connected to summer 115.

Figure 27:
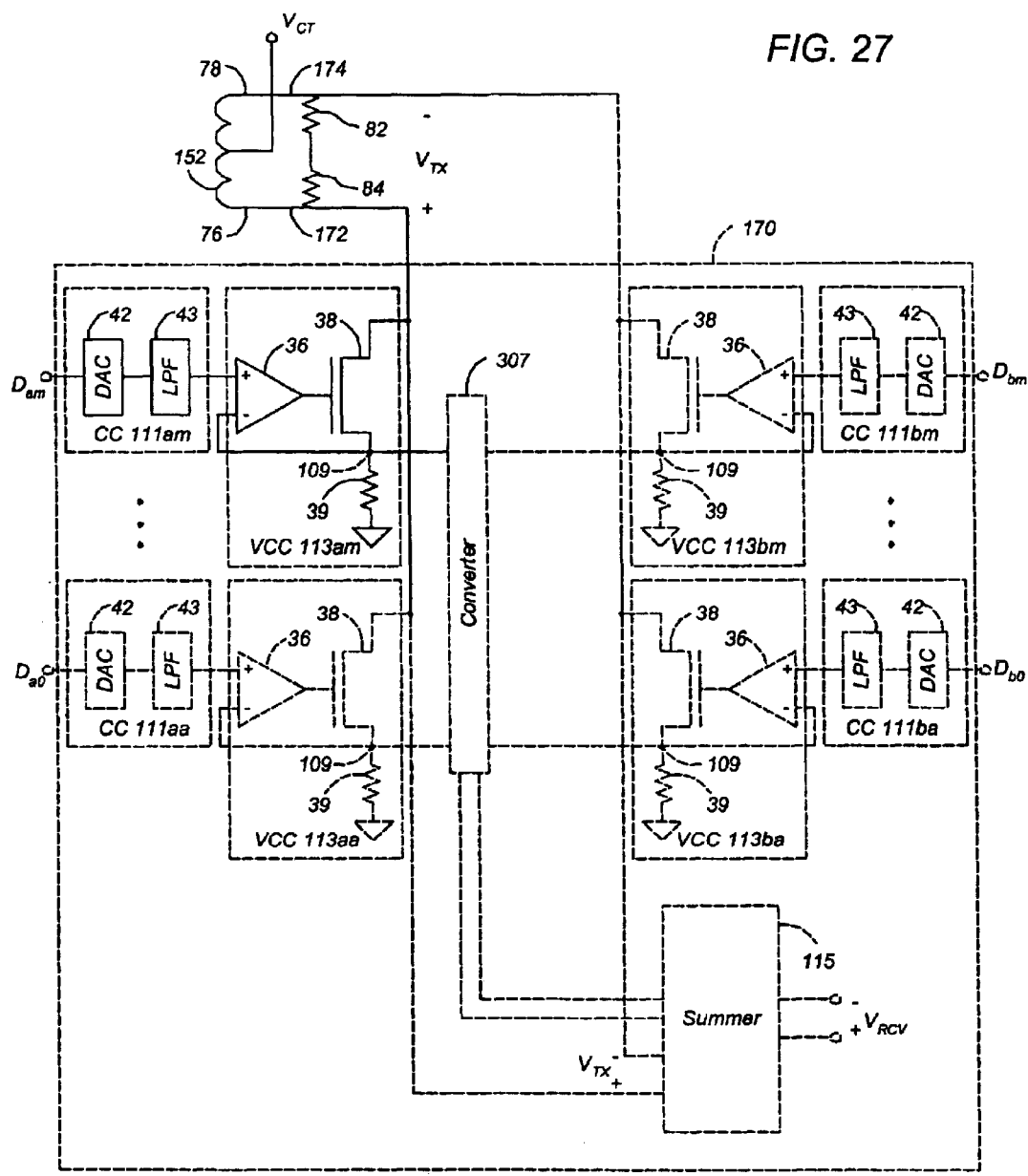
FIG. 27 is a detailed schematic diagram illustrating a fifth embodiment of a transceiver according to the principles of the present invention.

Another exemplary embodiment of Ethernet transceiver communications circuitry is illustrated in the schematic of FIG. 27. The integrated circuit 170 of FIG. 27 differs from that of FIG. 21 in that a single converter 307 replaces the multiple converters 107*a* through 107*m* of FIG. 21.

Figure 28:
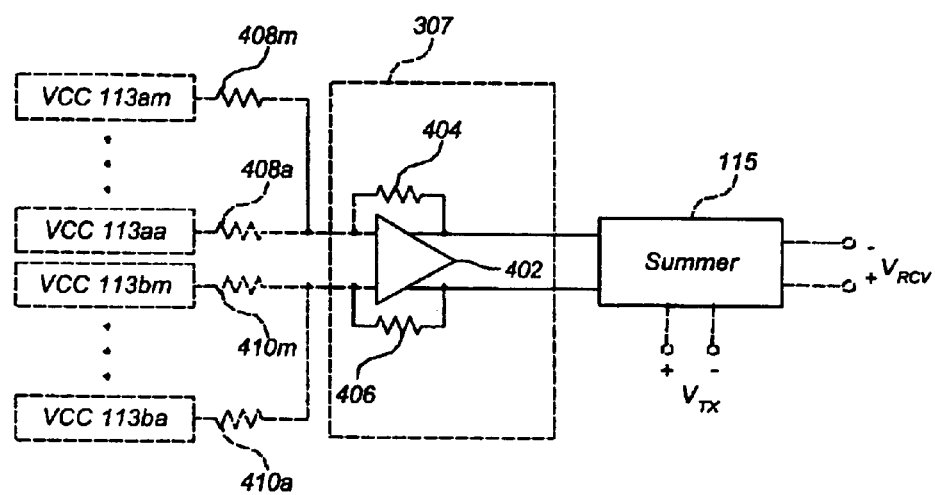
FIG. 28 shows detail of converter according to one implementation.

FIG. 28 shows detail of converter 307 according to one implementation. The outputs of VCCs 113*aa* through 113*am* are coupled through resistors 408*a* through 408*m* to one input of a differential operational amplifier 402 having feedback resistors 404 and 406. The outputs of VCCs 113*ba* through 113*bm* are coupled through resistors 410*a* through 410*m* to the other input of differential operational amplifier 402. The outputs of differential operational amplifier 402 are supplied to summer 115.

Figure 22:
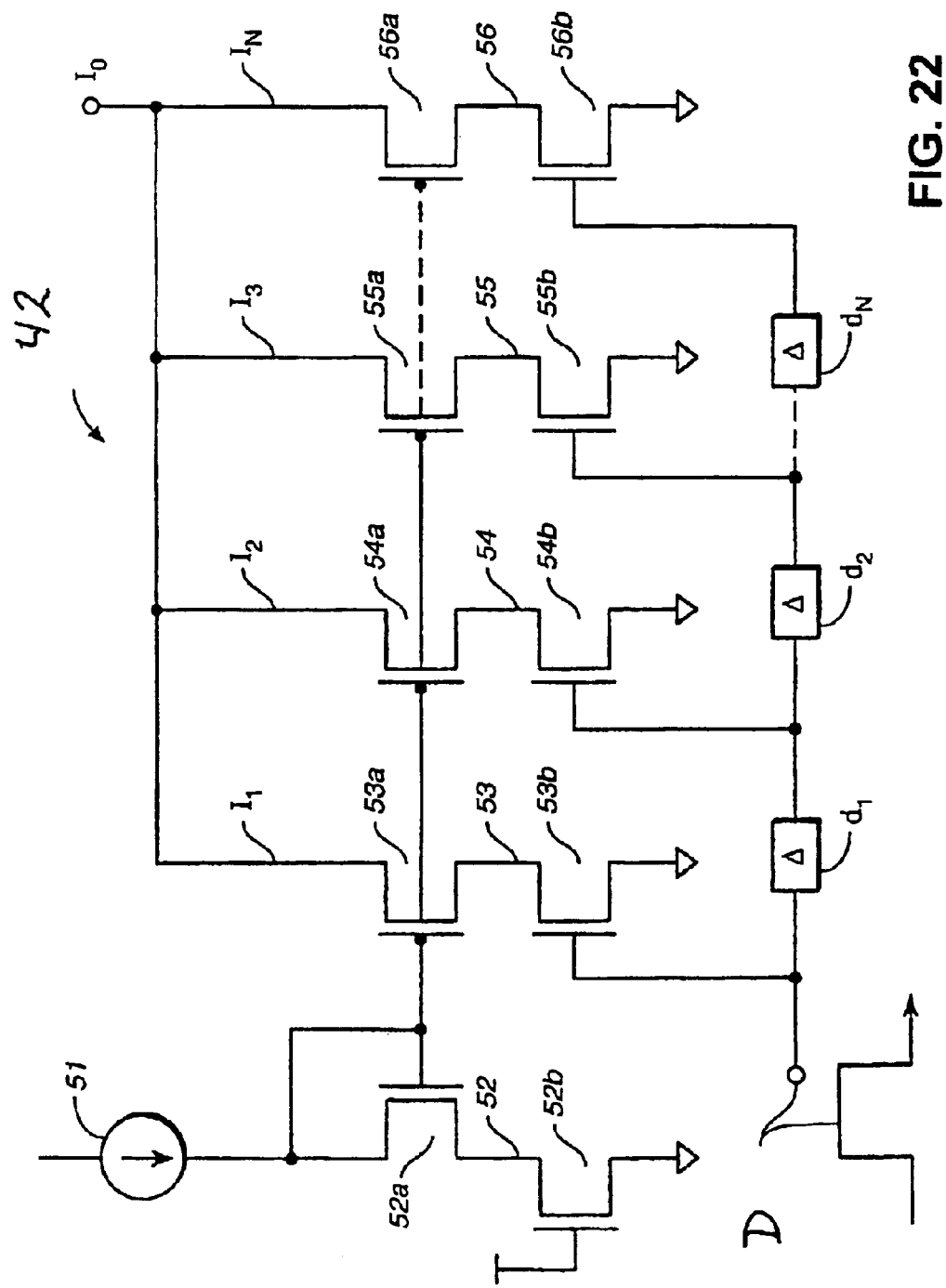
FIG. 22 shows detail of a DAC according to some implementations.

FIG. 22 shows detail of a DAC 42 according to some implementations. Referring to FIG. 22, DAC 42 operates as described above for the current source 50 of FIG. 12. DAC 42 receives a bit D from decoder 166, and provides a control current Io to LPF 43. Current Io is a staircase waveform such as those discussed above with reference to FIGS. 15*a* and 15*b*. Because this control signal determines the rise time of the output of each DAC, the LPFs 43 produce a smoother output. This embodiment solves two problems. First, by providing the LPFs with a staircase waveform, the LPFs merely smooth the staircase waveform rather than define rise time. Second, because the DACs 42 are disposed in parallel, there are no variations in rise time because each DAC 42 has substantially the same current passing therethrough; that is, there is no bandwidth variation with resultant differences in rise time. The DACs 42 may also be controlled by any appropriate circuitry, such as a decoder disposed prior to the DACs which would, in effect, select which DACs are activated by proper application of the input signals. In other implementations each DAC 42 provides a single-step waveform to a LPF 43.

Thus each control circuit 111 (formed by a DAC 42 and a LPF 43) provides a ramp waveform to one of the voltage-to-current converters 113, thereby controlling the slew rates of the voltage-to-current converters. Controlling the slew rates in this manner reduces unwanted high-frequency components that would be generated with higher slew rates. Further, because the slew rates are similar for each of the voltage-to-current converters, the bandwidth of the multi-level transmit signal is not dependent on the value of the control signal, resulting in a signal with small and uniform distortion across signal levels.

Figure 29:
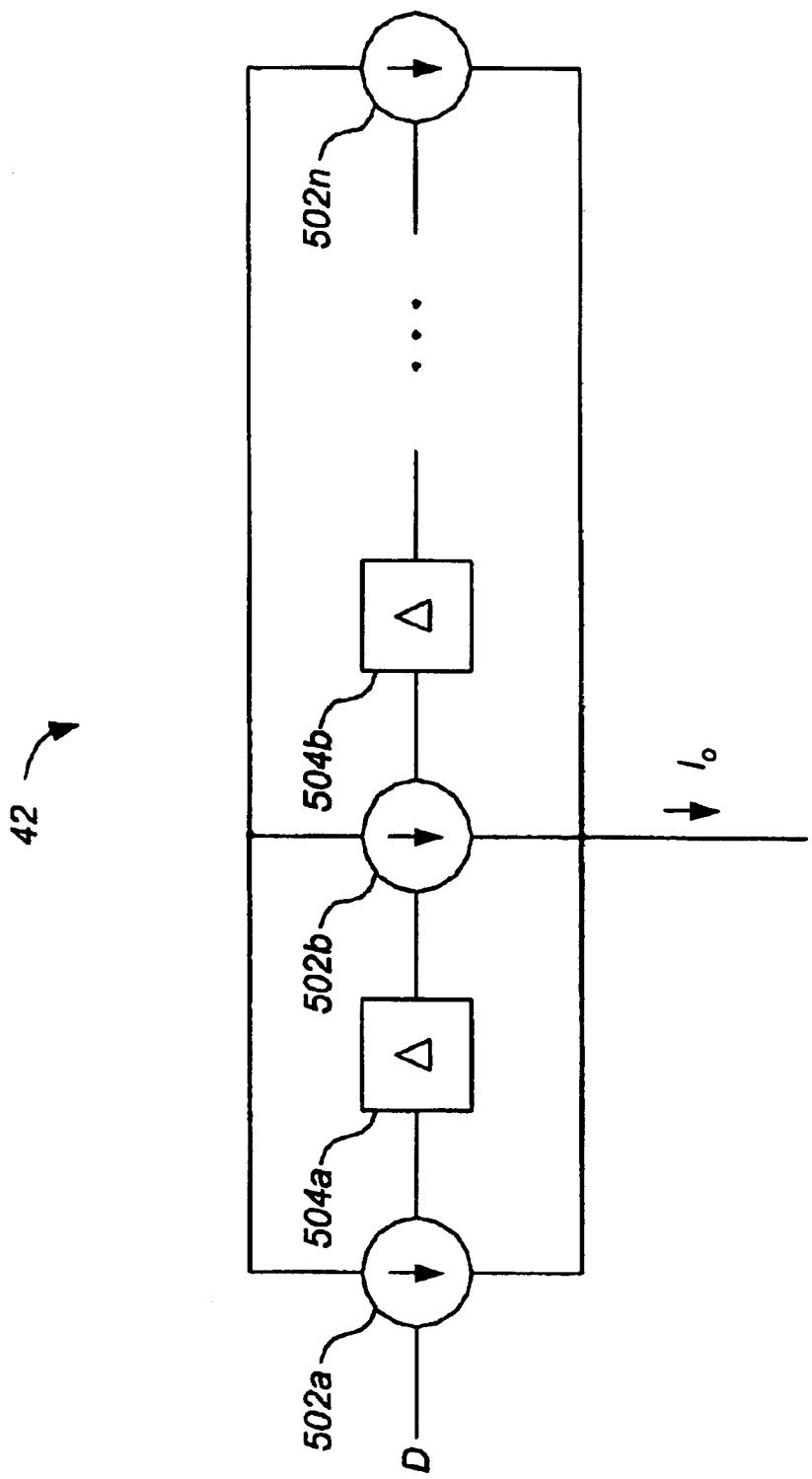
FIG. 29 shows detail of a DAC according to some implementations.

FIG. 29 shows detail of a DAC 42 according to some implementations. DAC 42 includes a plurality of current sources 502*a*, 502*b* through 502*n*, and a plurality of delay elements 504. Current source 502*a* receives a bit D from decoder 166, and generates a current in response. Delay unit 504*a* provides a delayed signal to a current source 502*b*, which provides a delayed current, and so on. The sum of the currents are provided as current Io.

Figure 23:
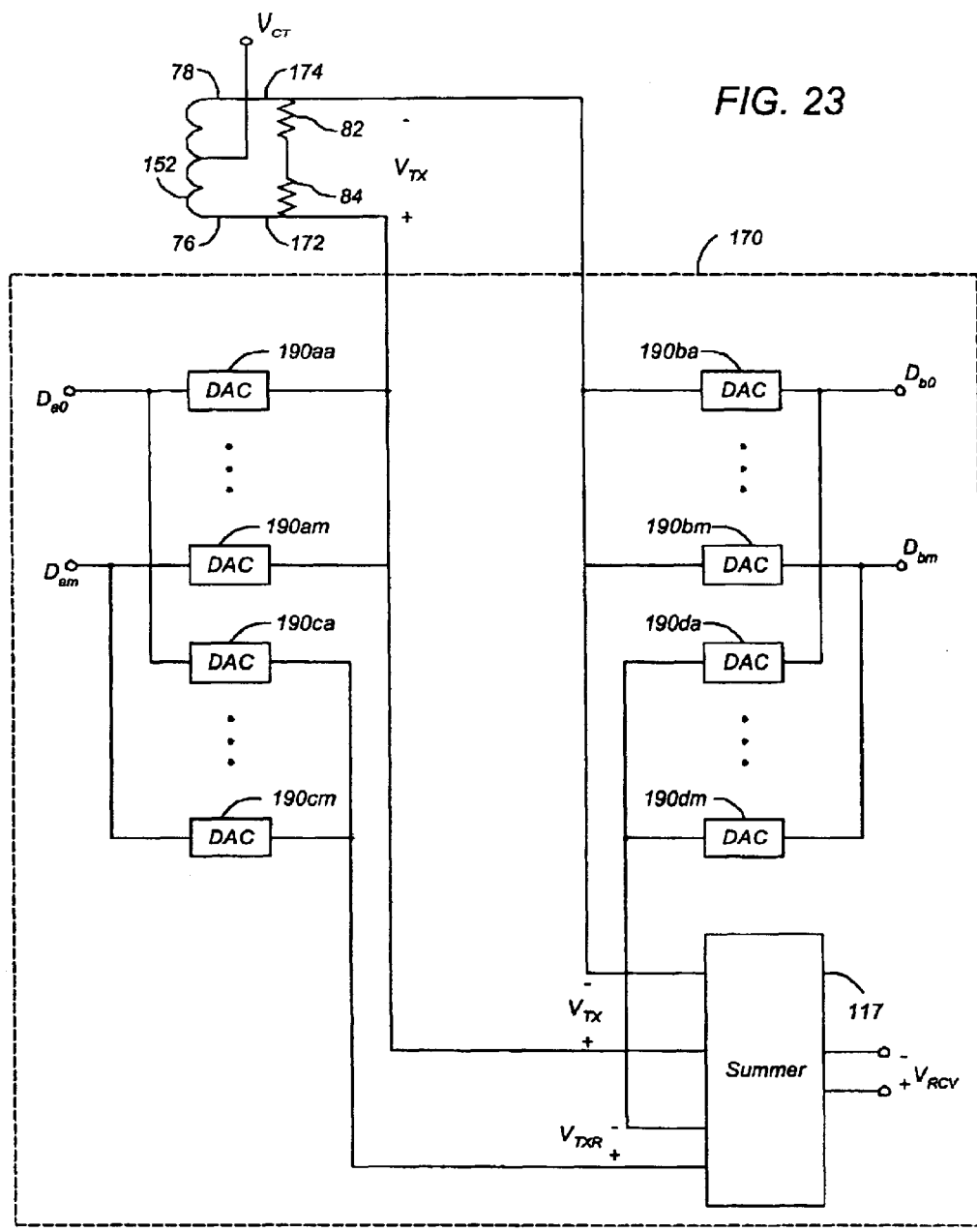
FIG. 23 is a detailed schematic diagram illustrating a fourth embodiment of a transceiver according to the principles of the present invention.

Another exemplary embodiment of Ethernet transceiver communications circuitry is illustrated in the schematic of FIG. 23. Referring to FIG. 23, integrated circuit 170 comprises m differential pairs of digital-to-analog converters (DAC) 190. Each DAC 190 provides a transmit signal component in response to a bit D of a digital control signal. The transmit signal components provided by DACs 190*aa* through 190*am* are combined to produce a first polarity of differential transmit signal $V_T$, which appears at terminals 172, 174 as a component of composite signal $V_{TX}$. Similarly, the transmit signal components provided by DACs 190*ba* through 190*bm* are combined to produce a second polarity of differential transmit signal $V_T$. Signal $V_{TX}$ is also fed to summer 117.

Summer 117 also receives a replica of the transmit signal components produced by DACs 190*a* and 190*b*. The replicas are produced by DACs 190*ca* through 190*cm* and DACs 190*da* through 190*dm*. Summer 117 subtracts the replica signal $V_{TXR}$ from the composite signal $V_{TX}$ to obtain the receive signal $V_{RCV}$. In some implementations each DAC 190 is implemented as shown in FIG. 22.

The individual components shown in outline or designated by blocks in the attached drawings are all well-known in the arts, and their specific construction and operation are not critical to the operation or best mode for carrying out the invention.

While the present invention has been described with respect to what is presently considered to be the preferred embodiments, it will be understood that the invention is not limited to the disclosed embodiments. To the contrary, the invention covers various modifications and equivalent arrangements included within the spirit and scope of the appended claims. The scope of the claims is to be accorded the broadest interpretation so as to encompass all such modifications and equivalent structures and functions. For example, the input signals for FIGS. 7, 11, 13, 14 and 16 may be varied to produce different output waveforms. Also, the linear ramp produced by the current source of FIGS. 11 and 13, may be even further processed by the current source of FIG. 7, to produce smooth transition areas. Such modifications are within the scope of the present invention. Also, whereas the illustrated transistors are preferably CMOS transistor, n-type or p-type transistors may also be employed with the present invention.

What is claimed is:

1. A gigabit Ethernet controller, comprising:
    sixteen sets of digital-to-analog converters (DACs),
        wherein the sixteen sets of DACs are arranged in parallel,
        wherein each DAC within a set of DACs is configured to receive an input signal and to provide an output signal,
        wherein each of the sixteen sets of DACs comprises a corresponding replica current circuit and
        wherein each of the sixteen sets of DACs comprises:
            N current sources arranged in parallel,
                wherein each of the N current sources includes a respective control input, and
                wherein the output signal provided by each DAC comprises a sum of outputs of the N current sources; and M delay elements,
wherein an input of a first one of the M delay elements receives the input signal,
wherein an mth one of the M delay elements includes an input in communication with an m−1th one of the M delay elements,
wherein an output of one of the M delay elements controls a corresponding control input of one of the N current sources, and
wherein a sum of each output signal from a respective one of the sixteen sets of DACs forms an accumulated output signal.

2. The gigabit Ethernet controller of claim 1, comprising:
a first sub-circuit including a first input configured to receive a composite differential signal including first and second differential signal components, a second input configured to receive a differential replica transmission signal, and an output configured to provide a differential receive signal comprising the composite differential signal minus the differential replica transmission signal;
a second sub-circuit configured to produce first and second single-ended replica transmission signals that together substantially comprise a replica of the first differential signal component of the composite differential signal; and
a third sub-circuit, coupled to the first and second sub-circuits, configured to produce the differential replica transmission signal from the first and second single-ended replica transmission signals.

3. The gigabit Ethernet controller of claim 1, wherein each of the replica current circuits comprises N replica current sources.

4. The gigabit Ethernet controller of claim 3, wherein outputs of the N replica current sources are summed together.

5. The gigabit Ethernet controller of claim 1, wherein outputs of the replica current circuits are summed together.

6. The gigabit Ethernet controller of claim 3, wherein outputs of the N replica current sources are summed to form a replica output signal.

7. The gigabit Ethernet controller of claim 1, wherein the gigabit Ethernet controller is arranged to receive a composite signal,
wherein the composite signal comprises a received far end signal and the accumulated output signal.

8. The gigabit Ethernet controller of claim 7, comprising a replica circuit,
wherein output of the replica circuit is combined with the composite signal.

9. The gigabit Ethernet controller of claim 1, wherein N is equal to ten.

10. The gigabit Ethernet controller of claim 1, comprising:
a summer for summing each output signal from the respective one of the sixteen sets of DACs.

11. The gigabit Ethernet controller of claim 1, wherein each of the N current sources of each DAC is arranged in a differential configuration.

12. The gigabit Ethernet controller of claim 1, wherein the M delay elements of each DAC comprise at least one delay lock loop.

13. The gigabit Ethernet controller of claim 1, wherein the accumulated output signal comprises a Class B signal.

14. The gigabit Ethernet controller of claim 1, wherein a first set of the sixteen sets of DACs is configured to produce a first polarity of a differential composite signal comprising transmit signal components output by the DACs of the first set, and configured to produce a first polarity of a differential replica signal comprising replicas of the transmit signal components output by the DACs of the first set.

15. The gigabit Ethernet controller of claim 14, wherein the first set comprises five of the sixteen sets of DACS.

16. The gigabit Ethernet controller of claim 14, wherein a second set of the sixteen sets of DACs is configured to produce a second polarity of the differential composite signal comprising transmit signal components output by the DACs of the second set, and configured to produce a second polarity of the differential replica signal comprising replicas of the transmit signal components output by the DACs of the second set.

17. The gigabit Ethernet controller of claim 16, wherein the second set comprises five of the sixteen sets of DACs.

18. The gigabit Ethernet controller of claim 16, wherein a difference signal is produced comprising a difference between the differential composite signal and the differential replica signal.

19. The gigabit Ethernet controller of claim 18, wherein the difference signal comprises a receive signal.

20. A gigabit Ethernet controller, comprising:
sixteen sets of means for converting digital-to-analog signals,
wherein the sixteen sets of digital-to-analog signal converting means are arranged in parallel,
wherein each digital-to-analog signal converting means within a set of digital-to-analog signal converting means is configured to receive an input signal and to provide an output signal,
wherein each of the sixteen sets of digital-to-analog signal converting means comprises a corresponding replica current means, and
wherein each of the sixteen sets of digital-to-analog signal converting means comprises:
N means for generating current arranged in parallel,
wherein each of the N current generating means includes a respective means for control inputting, and
wherein the output signal provided by each digital-to-analog signal converting means comprises a sum of outputs of the N current generating means; and
M means for delaying signals,
wherein a means for inputting of a first one of the M signal delaying means receives the input signal,
wherein an mth one of the M signal delaying means includes means for inputting in communication with an m−1th one of the M signal delaying means,
wherein a means for outputting of one of the M signal delaying means controls a corresponding control inputting means of one of the N current generating means, and
wherein a sum of each output signal from a respective one of the sixteen sets of digital-to-analog signal converting means forms an accumulated output signal.

21. The gigabit Ethernet controller of claim 20, comprising:
a first circuit means including a first input means configured to receive a composite differential signal including first and second differential signal components, a second input means configured to receive a differential replica transmission signal, and an output means configured to provide a differential receive signal comprising the composite differential signal minus the differential replica transmission signal;

a second circuit means configured to produce first and second single-ended replica transmission signals that together substantially comprise a replica of the first differential signal component of the composite differential signal; and a third circuit means, coupled to the first and second circuit means, configured to produce the differential replica transmission signal from the first and second single-ended replica transmission signals.

22. The gigabit Ethernet controller of claim 20, wherein each of the replica current means comprises N means for generating a replica current.

23. The gigabit Ethernet controller of claim 22, wherein outputs of the N replica current generating means are summed together.

24. The gigabit Ethernet controller of claim 20, wherein outputs of the replica current means are summed together.

25. The gigabit Ethernet controller of claim 22, wherein outputs of the N replica current generating means are summed to form a replica output signal.

26. The gigabit Ethernet controller of claim 20, wherein the gigabit Ethernet controller is arranged to receive a composite signal, wherein the composite signal comprises a received far end signal and the accumulated output signal.

27. The gigabit Ethernet controller of claim 26, comprising a replica means, wherein output of the replica means is combined with the composite signal.

28. The gigabit Ethernet controller of claim 20, wherein N is equal to ten.

29. The gigabit Ethernet controller of claim 20, comprising:

means for summing each output signal from the respective one of the sixteen sets of digital-to-analog signal converting means.

30. The gigabit Ethernet controller of claim 20, wherein each of the N current generating means of each digital-to-analog signal converting means is arranged in a differential configuration.

31. The gigabit Ethernet controller of claim 20, wherein the M signal delaying means of each digital-to-analog signal converting means comprise at least one delay lock loop means.

32. The gigabit Ethernet controller of claim 20, wherein the accumulated output signal comprises a Class B signal.

33. The gigabit Ethernet controller of claim 20, wherein a first set of the sixteen sets of digital-to-analog signal converting means is configured to produce a first polarity of a differential composite signal comprising transmit signal components output by the digital-to-analog signal converting means of the first set, and configured to produce a first polarity of a differential replica signal comprising replicas of the transmit signal components output by the digital-to-analog signal converting means of the first set.

34. The gigabit Ethernet controller of claim 33, wherein the first set comprises five of the sixteen sets of digital-to-analog signal converting means.

35. The gigabit Ethernet controller of claim 33, wherein a second set of the sixteen sets of digital-to-analog signal converting means is configured to produce a second polarity of the differential composite signal comprising transmit signal components output by the digital-to-analog signal converting means of the second set, and configured to produce a second polarity of the differential replica signal comprising replicas of the transmit signal components output by the digital-to-analog signal converting means of the second set.

36. The gigabit Ethernet controller of claim 35, wherein the second set comprises five of the sixteen sets of digital-to-analog signal converting means.

37. The gigabit Ethernet controller of claim 35, wherein a difference signal is produced comprising a difference between the differential composite signal and the differential replica signal.

38. The gigabit Ethernet controller of claim 37, wherein the difference signal comprises a receive signal.

39. A gigabit Ethernet controller, comprising:

sixteen sets of transmitters,
wherein the sixteen sets of transmitters are arranged in parallel,
wherein each transmitter within a set of transmitters is configured to receive an input signal and to provide an output signal,
wherein each of the sixteen sets of transmitters comprises a corresponding replica current circuit, and
wherein each transmitter comprises:
N current sources arranged in parallel,
wherein each of the N current sources includes a respective control input, and
wherein the output signal provided by each transmitter comprises a sum of outputs of the N current sources; and
M delay elements,
wherein an input of a first one of the M delay elements receives the input signal,
wherein an mth one of the M delay elements includes an input in communication with an m−1th one of the M delay elements,
wherein an output of one of the M delay elements controls a corresponding control input of one of the N current sources, and
wherein a sum of each output signal from a respective one of the sixteen sets of transmitters forms an accumulated output signal.

40. The gigabit Ethernet controller of claim 39, comprising:

a first sub-circuit including a first input configured to receive a composite differential signal including first and second differential signal components, a second input configured to receive a differential replica transmission signal, and an output configured to provide a differential receive signal comprising the composite differential signal minus the differential replica transmission signal;

a second sub-circuit configured to produce first and second single-ended replica transmission signals that together substantially comprise a replica of the first differential signal component of the composite differential signal; and a third sub-circuit, coupled 10 the first and second sub-circuits, configured to produce the differential replica transmission signal from the first and second single-ended replica transmission signals.

41. The gigabit Ethernet controller of claim 39, wherein each of the replica current circuits comprises N replica current sources.

42. The gigabit Ethernet controller of claim 41, wherein outputs of the N replica current sources are summed together.

43. The gigabit Ethernet controller of claim 39, wherein outputs of the replica current circuits are summed together.

44. The gigabit Ethernet controller of claim 41, wherein outputs of the N replica current sources are summed to form a replica output signal.

45. The gigabit Ethernet controller of claim 39, wherein the gigabit Ethernet controller is arranged to receive a composite signal, wherein the composite signal comprises a received far end signal and the accumulated output signal.

46. The gigabit Ethernet controller of claim 45, comprising a replica circuit, wherein output of the replica circuit is combined with the composite signal.

47. The gigabit Ethernet controller of claim 39, wherein N is equal to ten.

48. The gigabit Ethernet controller of claim 39, comprising:

a summer for summing each output signal from the respective one of the sixteen sets of transmitters.

49. The gigabit Ethernet controller of claim 39, wherein each of the N current sources of each transmitter is arranged in a differential configuration.

50. The gigabit Ethernet controller of claim 39, wherein the M delay elements of each transmitter comprise at least one delay lock loop.

51. The gigabit Ethernet controller of claim 39, wherein the accumulated output signal comprises a Class B signal.

52. The gigabit Ethernet controller of claim 39, wherein a first set of the sixteen sets of transmitters is configured to produce a first polarity of a differential composite signal comprising transmit signal components output by the transmitters of the first set, and configured to produce a first polarity of a differential replica signal comprising replicas of the transmit signal components output by the transmitters of the first set.

53. The gigabit Ethernet controller of claim 52, wherein the first set comprises five of the sixteen sets of transmitters.

54. The gigabit Ethernet controller of claim 52, wherein a second set of the sixteen sets of transmitters is configured to produce a second polarity of the differential composite signal comprising transmit signal components output by the transmitters of the second set, and configured to produce a second polarity of the differential replica signal comprising replicas of the transmit signal components output by the transmitters of the second set.

55. The gigabit Ethernet controller of claim 54, wherein the second set comprises five of the sixteen sets of transmitters.

56. The gigabit Ethernet controller of claim 54, wherein a difference signal is produced comprising a difference between the differential composite signal and the differential replica signal.

57. The gigabit Ethernet controller of claim 56, wherein the difference signal comprises a receive signal.

58. A gigabit Ethernet controller, comprising:

sixteen sets of means for transmitting signals, wherein the sixteen sets of signal transmitting means are arranged in parallel, wherein each signal transmitting means within a set of signal transmitting means is configured to receive an input signal and to provide an output signal, wherein each of the sixteen sets of signal transmitting means comprises a corresponding replica current means, and wherein each signal transmitting means comprises:

N means for generating current arranged in parallel, wherein each of the N current generating means includes a respective means for control inputting, and wherein the output signal provided by each signal transmitting means comprises a sum of outputs of the N current generating means; and M means for delaying signals, wherein a means for inputting of a first one of the M signal delaying means receives the input signal, wherein an mth one of the M signal delaying means includes means for inputting in communication with an m−1th one of the M signal delaying means, wherein means for outputting of one of the M signal delaying means controls a corresponding control inputting means of one of the N current generating means, and wherein a sum of each output signal from a respective one of the sixteen sets of signal transmitting means forms an accumulated output signal.

59. The gigabit Ethernet controller of claim 58, comprising:

a first circuit means including a first input means configured to receive a composite differential signal including first and second differential signal components, a second input means configured to receive a differential replica transmission signal, and an output means configured to provide a differential receive signal comprising the composite differential signal minus the differential replica transmission signal;

a second circuit means configured to produce first and second single-ended replica transmission signals that together substantially comprise a replica of the first differential signal component of the composite differential signal; and a third circuit means, coupled to the first and second circuit means, configured to produce the differential replica transmission signal from the first and second single-ended replica transmission signals.

60. The gigabit Ethernet controller of claim 58, wherein each of the replica current means comprises N means for generating a replica current.

61. The gigabit Ethernet controller of claim 60, wherein outputs of the N replica current generating means are summed together.

62. The gigabit Ethernet controller of claim 58, wherein outputs each of the replica current means are summed together.

63. The gigabit Ethernet controller of claim 60, wherein outputs of the N replica current generating means are summed to form a replica output signal.

64. The gigabit Ethernet controller of claim 58, wherein the gigabit Ethernet controller is arranged to receive a composite signal, wherein the composite signal comprises a received far end signal and the accumulated output signal.

65. The gigabit Ethernet controller of claim 64, comprising a replica means, wherein output of the replica means is combined with the composite signal.

66. The gigabit Ethernet controller of claim 58, wherein N is equal to ten.

67. The gigabit Ethernet controller of claim 58, comprising:

means for summing each output signal from the respective one of the sixteen sets of signal transmitting means.

68. The gigabit Ethernet controller of claim 58, wherein each of the N current generating means of each signal transmitting means is arranged in a differential configuration.

69. The gigabit Ethernet controller of claim 58, wherein the M signal delaying means of each signal transmitting means comprise at least one delay lock loop means.

70. The gigabit Ethernet controller of claim 58, wherein the accumulated output signal comprises a Class B signal.

71. The gigabit Ethernet controller of claim 58, wherein a first set of the sixteen sets of signal transmitting means is configured to produce a first polarity of a differential composite signal comprising transmit signal components output by the signal transmitting means of the first set, and configured to produce a first polarity of a differential replica signal comprising replicas of the transmit signal components output by the signal transmitting means of the first set.

72. The gigabit Ethernet controller of claim 71, wherein the first set comprises five of the sixteen sets of signal transmitting means.

73. The gigabit Ethernet controller of claim 71, wherein a second set of the sixteen sets of signal transmitting means is configured to produce a second polarity of the differential composite signal comprising transmit signal components output by the signal transmitting means of the second set, and configured to produce a second polarity of the differential replica signal comprising replicas of the transmit signal components output by the signal transmitting means of the second set.

74. The gigabit Ethernet controller of claim 73, wherein the second set comprises five of the sixteen sets of signal transmitting means.

75. The gigabit Ethernet controller of claim 73, wherein a difference signal is produced comprising a difference between the differential composite signal and the differential replica signal.

76. The gigabit Ethernet controller of claim 75, wherein the difference signal comprises a receive signal.

77. A communication method, comprising the steps of:
  a.) receiving sixteen input signals;
  b.) providing sixteen transmit signal components in accordance with the sixteen input signals,
     wherein for each transmit signal component, step (b) comprises the steps of:
     c.) supplying N sources of current;
     d.) controlling the supply of current from each of the N sources of current;
     e.) delaying current from M of the N sources of current,
        wherein an input of a first one of the M delaying steps receives an input signal,
        wherein an input of the mth one of the M delaying steps receives a signal from an m−1th one of the M delaying steps, and
        wherein an output of one of the M delaying steps controls a corresponding one of the N sources of current; and
     f.) summing the delayed currents;
  g.) providing sixteen replica current signals in accordance with the sixteen input signals; and
  h.) combining the sixteen transmit signal components to produce a multilevel output signal.

78. The method of claim 77, comprising the steps of:
  i.) receiving a composite differential signal including first and second differential signal components; j.) receiving a differential replica transmission signal;
  k.) providing a differential receive signal comprising the composite differential signal minus the differential replica transmission signal;
  l.) producing first and second single-ended replica transmission signals that together substantially comprise a replica of the first differential signal component of the composite differential signal; and
  m.) generating the differential replica transmission signal from the first and second single-ended replica transmission signals.

79. The method of claim 77, wherein for each replica current signal, step (h) comprises the step of:
  i.) supplying N sources of replica current.

80. The method of claim 79, comprising the step of:
  j.) summing outputs of the N sources of replica current.

81. The method of claim 77, comprising the step of:
  k.) summing the sixteen replica current signals.

82. The method of claim 79, comprising the step of:
  j.) summing outputs of the N sources of replica current to form a replica output signal.

83. The method of claim 77, comprising the step of:
  i.) receiving a composite signal,
     wherein the composite signal comprises a received far end signal and the multi-level output signal.

84. The method of claim 83, comprising the step of:
  j.) combining a replica output signal with the composite signal.

85. The method of claim 77, wherein N is equal to ten.

86. The method of claim 77, wherein the output signal comprises a Class B signal.

87. The method of claim 77, comprising the steps of:
  i.) receiving a first polarity of a differential composite signal comprising transmit signal components in accordance with the sixteen input signals; and
  j.) receiving a first polarity of a differential replica signal comprising replicas of the transmit signal components in accordance with the sixteen input signals.

88. The method of claim 87, comprising the steps of:
  k.) receiving a second polarity of the differential composite signal comprising transmit signal components in accordance with the sixteen input signals; and
  l.) receiving a second polarity of the differential replica signal comprising replicas of the transmit signal components in accordance with the sixteen input signals.

89. The method of claim 88, comprising the step of:
  m.) producing a difference signal comprising a difference between the differential composite signal and the differential replica signal.

90. The method of claim 89, wherein the difference signal comprises a receive signal.

91. A communication circuit, comprising:
  a plurality of sets of digital-to-analog converters (DACs),
     wherein the plurality of sets of DACs are arranged in parallel,
     wherein each DAC within a set of DACs is configured to receive an input signal and to provide an output signal,
     wherein each of the plurality of sets of DACs comprises a corresponding replica current circuit, and
     wherein each DAC comprises:
        N current sources arranged in parallel,
           wherein each of the N current sources includes a respective control input, and
           wherein the output signal provided by each DAC comprises a sum of outputs of the N current sources; and M delay elements,
   wherein an mth one of the M delay elements includes an input in communication with an m−1th one of the M delay elements,
   wherein an output of one of the M delay elements controls a corresponding control input of one of the N current sources,
   wherein the input of a first one of the M delay elements receives the input signal, and
wherein a sum of each output signal from a respective one of the plurality of sets of DACs forms an accumulated output signal.

92. The communication circuit of claim 91, comprising:
a first sub-circuit including a first input configured to receive a composite differential signal including first and second differential signal components, a second input configured to receive a differential replica transmission signal, and an output configured to provide a differential receive signal comprising the composite differential signal minus the differential replica transmission signal;
a second sub-circuit configured to produce first and second single-ended replica transmission signals that together substantially comprise a replica of the first differential signal component of the composite differential signal; and
a third sub-circuit, coupled to the first and second sub-circuits, configured to produce the differential replica transmission signal from the first and second single-ended replica transmission signals.

93. The communication circuit of claim 91, wherein each of the replica current circuits comprises N replica current sources.

94. The communication circuit of claim 93, wherein outputs of the N replica current sources are summed together.

95. The communication circuit of claim 91, wherein outputs of the replica current circuits are summed together.

96. The communication circuit of claim 93, wherein outputs of the N replica current sources are summed to form a replica output signal.

97. The communication circuit of claim 91, wherein the communication circuit is arranged to receive a composite signal,
wherein the composite signal comprises a received far end signal and the accumulated output signal.

98. The communication circuit of claim 97, comprising a replica circuit,
wherein output of the replica circuit is combined with the composite signal.

99. The communication circuit of claim 91, comprising:
a summer for summing each output signal from the respective one of the plurality of sets of DACs.

100. The communication circuit of claim 91, wherein the plurality of sets of DACs comprises K sets of DACs, and
wherein the accumulated output signal comprises a multi-level output signal.

101. The communication circuit of claim 91, wherein each of the N current sources of each DAC is arranged in a differential configuration.

102. The communication circuit of claim 91, wherein the M delay elements of each DAC comprise at least one delay lock loop.

103. The communication circuit of claim 91, wherein the accumulated output signal comprises a Class B signal.

104. The communication circuit of claim 91, wherein a first set of the plurality of sets of DACs is configured to produce a first polarity of a differential composite signal comprising transmit signal components output by the DACs of the first set, and configured to produce a first polarity of a differential replica signal comprising replicas of the transmit signal components output by the DACs of the first set.

105. The communication circuit of claim 91, wherein a second set of the plurality of sets of DACs is configured to produce a second polarity of the differential composite signal comprising transmit signal components output by the DACs of the second set, and configured to produce a second polarity of the differential replica signal comprising replicas of the transmit signal components output by the DACs of the second set.

106. The communication circuit of claim 105, wherein a differential difference signal is produced comprising a difference between the differential composite signal and the differential replica signal.

107. The communication circuit of claim 106, wherein the differential difference signal comprises a receive signal.

108. The communication circuit of claim 91, wherein the communication circuit operates at up to gigabit speeds.

109. A communication circuit, comprising:
a plurality of sets of digital-to-analog converter (DAC) means,
   wherein the plurality of sets of DAC means are arranged in parallel,
   wherein each DAC means within a set of DAC means is configured to receive an input signal and to provide an output signal,
   wherein each of the plurality of sets of DAC means comprises a corresponding replica current means, and
   wherein each DAC means comprises:
      N current source means arranged in parallel,
         wherein each of the N current source means includes a respective means for control inputting, and
         wherein the output signal provided by each DAC means comprises a sum of outputs of the N current source means; and
      M delay means,
         wherein an mth one of the M delay means includes a means for inputting in communication with an m−1th one of the M delay means,
         wherein means for outputting of one of the M delay means controls a corresponding control inputting means of one of the N current source means, and
   wherein a sum of each output signal from a respective one of the plurality of sets of DAC means forms an accumulated output signal.

110. The communication circuit of claim 109, comprising:
a first circuit means including a first input means configured to receive a composite differential signal including first and second differential signal components, a second input means configured to receive a differential replica transmission signal, and an output means configured to provide a differential receive signal comprising the composite differential signal minus the differential replica transmission signal;
a second circuit means configured to produce first and second single-ended replica transmission signals that together substantially comprise a replica of the first differential signal component of the composite differential signal; and
a third circuit means, coupled to the first and second circuit means, configured to produce the differential replica transmission signal from the first and second single-ended replica transmission signals.

111. The communication circuit of claim 109, wherein each of the replica current means comprises N means for generating a replica current.

112. The communication circuit of claim 111, wherein outputs of the N replica current generating means are summed together.

113. The communication circuit of claim 109, wherein outputs of replica current means are summed together.

114. The communication circuit of claim 111, wherein outputs of the N replica current generating means are summed to form a replica output signal.

115. The communication circuit of claim 109, wherein the communication circuit is arranged to receive a composite signal,
wherein the composite signal comprises a received far end signal and the accumulated output signal.

116. The communication circuit of claim 115, comprising a replica means,
wherein output of the replica means is combined with the composite signal.

117. The communication circuit of claim 109, comprising:
means for summing each output signal from the respective one of the plurality of sets of DAC means.

118. The communication circuit of claim 109, wherein the plurality of sets of DAC means comprises K sets of DAC means, and
wherein the accumulated signal comprises a multi-level output signal.

119. The communication circuit of claim 109, wherein each of the N current source means of each DAC means is arranged in a differential configuration.

120. The communication circuit of claim 109, wherein the M delay means of each DAC means comprise at least one delay lock loop means.

121. The communication circuit of claim 109, wherein the accumulated output signal comprises a Class B signal.

122. The communication circuit of claim 109, wherein a first set of the plurality of sets of DAC means is configured to produce a first polarity of a differential composite signal comprising transmit signal components output by the DAC means of the first set, and configured to produce a first polarity of a differential replica signal comprising replicas of the transmit signal components output by the DAC means of the first set.

123. The communication circuit of claim 122, wherein a second set of the plurality of sets of DAC means is configured to produce a second polarity of the differential composite signal comprising transmit signal components output by the DAC means of the second set, and configured to produce a second polarity of the differential replica signal comprising replicas of the transmit signal components output by the DAC means of the second set.

124. The communication circuit of claim 123, wherein a differential difference signal is produced comprising a difference between the differential composite signal and the differential replica signal.

125. The communication circuit of claim 124, wherein the differential difference signal comprises a receive signal.

126. The communication circuit of claim 109, wherein the communication circuit operates at up to gigabit speeds.

127. An Ethernet controller, comprising:
a plurality of sets of transmitters,
wherein the plurality of sets of transmitters are arranged in parallel,
wherein each transmitter within a set of transmitters is configured to receive an input signal and to provide an output signal,
wherein each of the plurality of sets of transmitters comprises a corresponding replica current circuit, and
wherein each transmitter comprises:
N current sources arranged in parallel,
wherein each of the N current sources includes a respective control input, and
wherein the output signal provided by each transmitter comprises a sum of outputs of the N current sources; and
M delay elements,
wherein an mth one of the M delay elements includes an input in communication with an m−1th one of the M delay elements,
wherein an output of one of the M delay elements controls a corresponding control input of one of the N current sources,
wherein an input of a first one of the M delay elements receives the input signal, and
wherein a sum of each output signal from a respective one of the plurality of sets of transmitters forms an accumulated output signal.

128. The Ethernet controller of claim 127, comprising:
a first sub-circuit including a first input configured to receive a composite differential signal including first and second differential signal components, a second input configured to receive a differential replica transmission signal, and an output configured to provide a differential receive signal comprising the composite differential signal minus the differential replica transmission signal;
a second sub-circuit configured to produce first and second single-ended replica transmission signals that together substantially comprise a replica of the first differential signal component of the composite differential signal; and
a third sub-circuit, coupled to the first and second sub-circuits, configured to produce the differential replica transmission signal from the first and second single-ended replica transmission signals.

129. The Ethernet controller of claim 127, wherein each of the replica current circuits comprises N replica current sources.

130. The Ethernet controller of claim 129, wherein outputs of the N replica current sources are summed together.

131. The Ethernet controller of claim 127, wherein outputs of the replica current circuits are summed together.

132. The Ethernet controller of claim 129, wherein outputs of the N replica current sources are summed to form a replica output signal.

133. The Ethernet controller of claim 127, wherein the communication circuit is arranged to receive a composite signal,
wherein the composite signal comprises a received far end signal and the accumulated output signal.

134. The Ethernet controller of claim 133, comprising a replica circuit,
wherein output of the replica circuit is combined with the composite signal.

135. The Ethernet controller of claim 127, comprising:
a summer for summing each output signal from the respective one of the plurality of sets of transmitters.

136. The Ethernet controller of claim 127, wherein the plurality of sets of transmitters comprises K sets of transmitters, and wherein the accumulated output signal comprises a multilevel output signal.

137. The Ethernet controller of claim 127, wherein each of the N current sources of each transmitter is arranged in a differential configuration.

138. The Ethernet controller of claim 127, wherein the M delay elements of each transmitter comprise at least one delay lock loop.

139. The Ethernet controller of claim 127, wherein the accumulated output signal comprises a Class B signal.

140. The Ethernet controller of claim 127, wherein a first set of the plurality of sets of transmitters is configured to produce a first polarity of a differential composite signal comprising transmit signal components output by the transmitters of the first set, and configured to produce a first polarity of a differential replica signal comprising replicas of the transmit signal components output by the transmitters of the first set.

141. The Ethernet controller of claim 140, wherein a second set of the plurality of sets of transmitters is configured to produce a second polarity of the differential composite signal comprising transmit signal components output by the transmitters of the second set, and configured to produce a second polarity of the differential replica signal comprising replicas of the transmit signal components output by the transmitters of the second set.

142. The Ethernet controller of claim 141, wherein a differential difference signal is produced comprising a difference between the differential composite signal and the differential replica signal.

143. The Ethernet controller of claim 142, wherein the differential difference signal comprises a receive signal.

144. The Ethernet controller of claim 127, wherein the Ethernet controller operates at up to gigabit speeds.

145. An Ethernet controller, comprising:
a plurality of sets of transmitting means,
  wherein the plurality of sets of transmitting means are arranged in parallel,
  wherein each transmitting means within a set of transmitting means is configured to receive an input signal and to provide an output signal,
  wherein each of the plurality of sets of transmitting means comprises a corresponding replica current means, and
  wherein each transmitting means comprises:
    N current source means arranged in parallel,
      wherein each of the N current source means includes a respective means for control inputting, and
      wherein the output signal provided by each transmitting means comprises a sum of outputs of the N current source means; and
    M delay means,
      wherein an mth one of the M delay means includes a means for inputting in communication with an m−1th one of the M delay means,
      wherein means for outputting of one of the M delay means controls a corresponding control inputting means of one of the N current source means, and
  wherein a sum of each output signal from a respective one of the plurality of sets of transmitting means forms a transmit signal.

146. The Ethernet controller of claim 145, comprising:
a first circuit means including a first input means configured to receive a composite differential signal including first and second differential signal components, a second input means configured to receive a differential replica transmission signal, and an output means configured to provide a differential receive signal comprising the composite differential signal minus the differential replica transmission signal;
a second circuit means configured to produce first and second single-ended replica transmission signals that together substantially comprise a replica of the first differential signal component of the composite differential signal; and
a third circuit means, coupled to the first and second circuit means, configured to produce the differential replica transmission signal from the first and second single-ended replica transmission signals.

147. The Ethernet controller of claim 145, wherein each of the replica current means comprises N means for generating a replica current.

148. The Ethernet controller of claim 147, wherein outputs of the N replica current generating means are summed together.

149. The Ethernet controller of claim 145, wherein outputs of the replica current means are summed together.

150. The Ethernet controller of claim 147, wherein outputs of the N replica current generating means are summed to form a replica output signal.

151. The Ethernet controller of claim 145, wherein the communication circuit is arranged to receive a composite signal,
  wherein the composite signal comprises a received far end signal and the accumulated output signal.

152. The Ethernet controller of claim 151, comprising a replica means,
  wherein output of the replica means is combined with the composite signal.

153. The Ethernet controller of claim 145, comprising:
  means for summing each output signal from the respective one of the plurality of sets of transmitting means.

154. The Ethernet controller of claim 145, wherein the plurality of sets of transmitting means comprises K sets of transmitting means, and
  wherein the accumulated output signal comprises a multilevel output signal.

155. The Ethernet controller of claim 145, wherein each of the N current source means of each transmitting means is arranged in a differential configuration.

156. The Ethernet controller of claim 145, wherein the M delay means of each transmitting means comprise at least one delay lock loop means.

157. The Ethernet controller of claim 145, wherein the accumulated output signal comprises a Class B signal.

158. The Ethernet controller of claim 145, wherein a first set of the plurality of sets of transmitting means is configured to produce a first polarity of a differential composite signal comprising transmit signal components output by the transmitting means of the first set, and configured to produce a first polarity of a differential replica signal comprising replicas of the transmit signal components output by the transmitting means of the first set.

159. The Ethernet controller of claim 158, wherein a second set of the plurality of sets of transmitting means is configured to produce a second polarity of the differential composite signal comprising transmit signal components output by the transmitting means of the second set, and configured to produce a second polarity of the differential replica signal comprising replicas of the transmit signal components output by the transmitting means of the second set.

160. The Ethernet controller of claim 159, wherein a differential difference signal is produced comprising a difference between the differential composite signal and the differential replica signal.

161. The Ethernet controller of claim 160, wherein the differential difference signal comprises a receive signal.

162. The Ethernet controller of claim 145, wherein the Ethernet controller operates at up to gigabit speeds.

163. A communication method, comprising the steps of:
- a.) receiving K input signals;
- b.) providing K corresponding transmit signal components in accordance with each of the K input signals, wherein for each transmit signal component, step (b) comprises the steps of:
  - b1.) supplying N sources of current;
  - b2.) controlling the supply of current from each of the N sources of current;
  - b3.) delaying current from M of the N sources of current,
    - wherein an input of a first one of the M delaying steps receives an input signal,
    - wherein an input of the mth one of the M delaying steps receives a signal from an m−1th one of the M delaying steps, and
    - wherein an output of one of the M delaying steps controls a corresponding one of the N sources of current; and
  - b4.) summing the delayed currents;
- c.) providing K replica current signals in accordance with the K input signals; and
- d.) combining the K corresponding transmit signal components to produce a multi-level output signal.

164. The communication method of claim 163, comprising the steps of:
- e.) receiving a composite differential signal including first and second differential signal components;
- f.) receiving a differential replica transmission signal;
- g.) providing a differential receive signal comprising the composite differential signal minus the differential replica transmission signal;
- h.) producing first and second single-ended replica transmission signals that together substantially comprise a replica of the first differential signal component of the composite differential signal; and
- i.) generating the differential replica transmission signal from the first and second single-ended replica transmission signals.

165. The communication method of claim 163, wherein for each replica current signal, step (c) comprises the step of:
- e.) supplying N sources of replica current.

166. The communication method of claim 165, comprising the step of:
- f.) summing outputs of the N sources of replica current.

167. The communication method of claim 163, comprising the step of:
- e.) summing the K replica current signals.

168. The communication method of claim 165, comprising the step of:
- f.) summing outputs of the N sources of replica current to form a replica output signal.

169. The communication method of claim 163, comprising the step of:
- e.) receiving a composite signal,
  - wherein the composite signal comprises a received far end signal and the multi-level output signal.

170. The communication method of claim 169, comprising the step of:
- f.) combining a replica output signal with the composite signal.

171. The method of claim 163, wherein the output signal comprises a Class B signal.

172. The method of claim 163, comprising the steps of:
- (e.) receiving a first polarity of a differential composite signal comprising transmit signal components in accordance with the K input signals; and
- (f.) receiving a first polarity of a differential replica signal comprising replicas of the transmit signal components in accordance with the K input signals.

173. The method of claim 172, comprising the steps of:
- (g.) receiving a second polarity of the differential composite signal comprising transmit signal components in accordance with the K input signals; and
- (h.) receiving a second polarity of the differential replica signal comprising replicas of the transmit signal components in accordance with the K input signals.

174. The method of claim 173, comprising the step of:
- (i) producing a differential difference signal comprising a difference between the differential composite signal and the differential replica signal.

175. The method of claim 174, wherein the differential difference signal comprises a receive signal.

* * * * *

UNITED STATES PATENT AND TRADEMARK OFFICE
CERTIFICATE OF CORRECTION

PATENT NO.        : 7,280,060 B1                                    Page 1 of 1
APPLICATION NO.   : 10/972143
DATED             : October 9, 2007
INVENTOR(S)       : Sehat Sutardja et al.

It is certified that error appears in the above-identified patent and that said Letters Patent is hereby corrected as shown below:

| | |
|---|---|
| On the Title Page Item (56) Page 2, Line 66 | Delete "B2 10/2002 Patel" and insert -- B1 6/2002 Lye, et al -- |
| On the Title Page Item (56) Page 4, Line 51 | Delete "1996" and insert -- 1995 -- |
| On the Title Page Item (56) Page 4, Line 53 | Delete "1996, pgs. 730-733" and insert -- 1995 pp. 145-155 -- |
| On the Title Page Item (56) Page 5, Line 44 | Delete "GH2" and insert -- GHz -- |
| Column 7, Line 61 | Delete "A" and insert -- Δ -- |
| Column 8, Line 20 | Delete "B1"BN" and insert -- B1-BN -- |
| Column 10, Line 41 | Insert -- . -- after "ground" |
| Column 18, Line 58 | Delete "10" and insert -- to -- |
| Column 20, Line 48 | Delete "each" after "outputs" |

Signed and Sealed this

Eighth Day of July, 2008

JON W. DUDAS
*Director of the United States Patent and Trademark Office*